(12) United States Patent
Whetsel

(10) Patent No.: US 7,493,537 B2
(45) Date of Patent: *Feb. 17, 2009

(54) PROPAGATION TEST STROBE CIRCUITRY WITH BOUNDARY SCAN CIRCUITRY

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/833,088

(22) Filed: Aug. 2, 2007

(65) Prior Publication Data

US 2007/0300109 A1 Dec. 27, 2007

Related U.S. Application Data

(62) Division of application No. 11/369,739, filed on Mar. 7, 2006, now Pat. No. 7,269,769, which is a division of application No. 10/364,100, filed on Feb. 11, 2003, now Pat. No. 7,073,111.

(60) Provisional application No. 60/387,043, filed on Jun. 10, 2002.

(51) Int. Cl.
*G01R 31/28* (2006.01)

(52) U.S. Cl. ...................................................... 714/727
(58) Field of Classification Search .................... None
See application file for complete search history.

(56) References Cited

U.S. PATENT DOCUMENTS

| 5,862,152 A | * | 1/1999 | Handly et al. | ................ 714/727 |
| 5,978,902 A | * | 11/1999 | Mann | ......................... 712/227 |
| 6,158,034 A | * | 12/2000 | Ramamurthy et al. | ....... 714/727 |
| 6,286,119 B1 | * | 9/2001 | Wu et al. | ..................... 714/726 |

* cited by examiner

*Primary Examiner*—Christine T Tu
(74) *Attorney, Agent, or Firm*—Lawrence J. Bassuk; W. James Brady; Frederick J. Telecky, Jr.

(57) ABSTRACT

A Propagation Test instruction, a Decay Test instruction and a Cycle Test instruction provide testing of DC and AC interconnect circuits between circuits including JTAG boundary scan cells. A few additions to the Test Access Port circuitry, including gating producing a Capture Test Strobe (CTS) signal, and the boundary scan cells are required to implement the additional instructions. The instructions are extensions of the conventional JTAG operating structure.

6 Claims, 20 Drawing Sheets

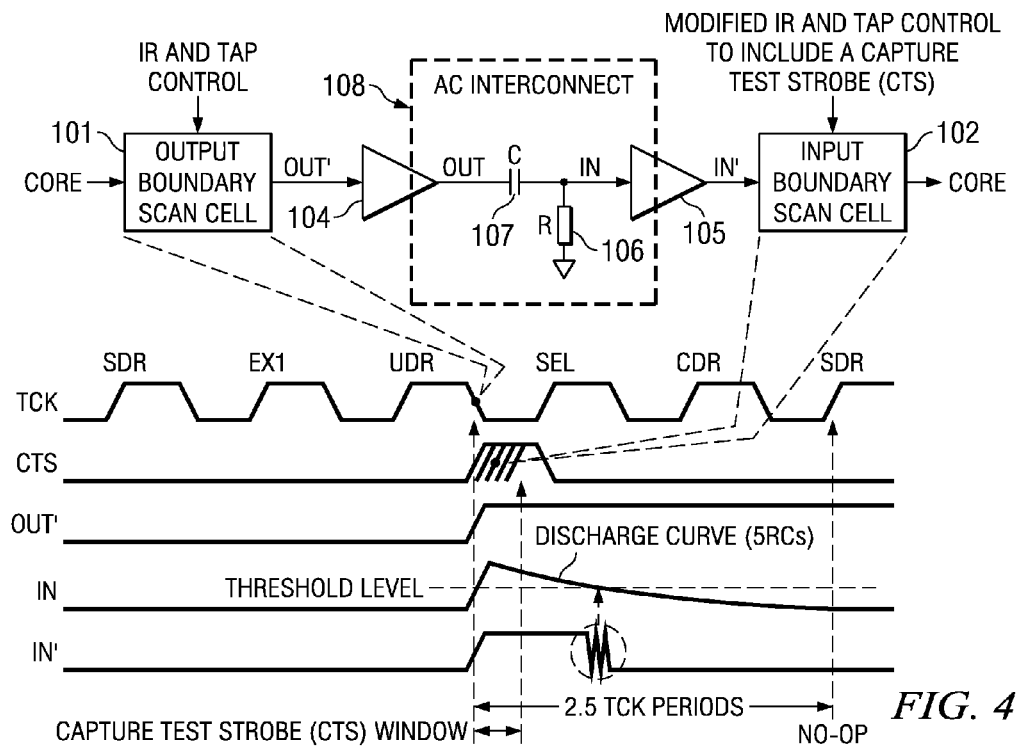
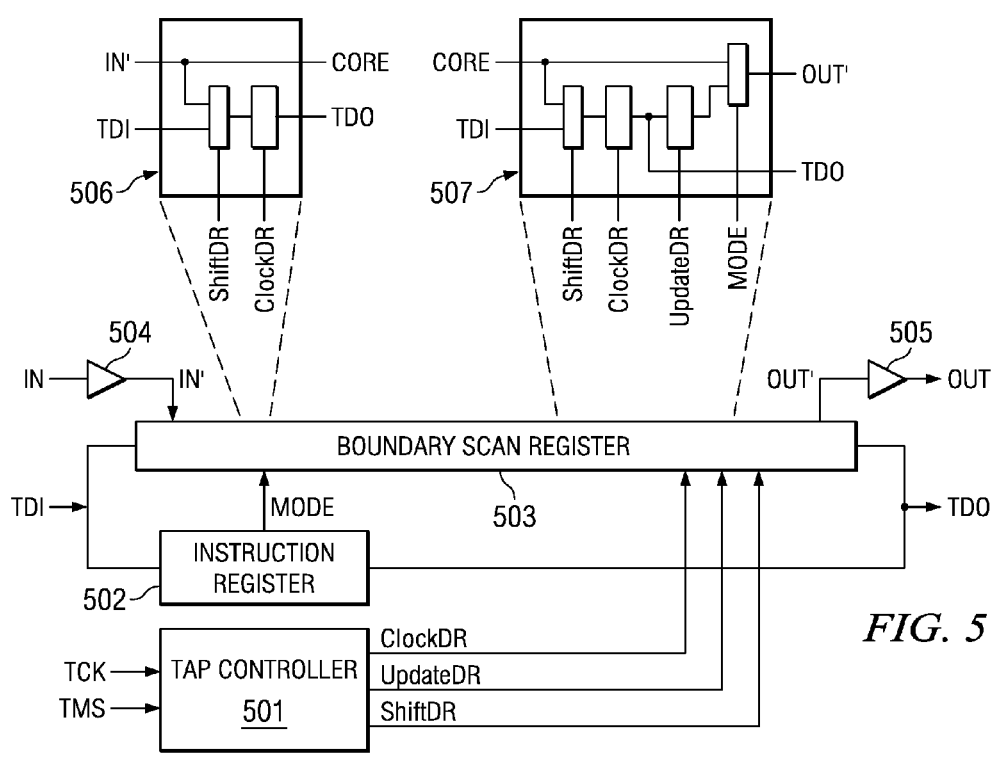
FIG. 4
FIG. 5

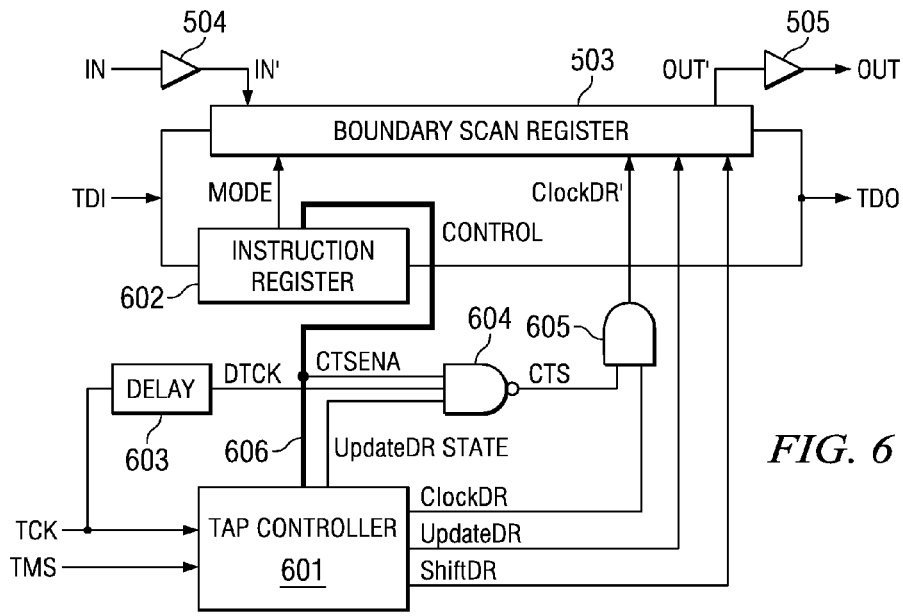
FIG. 6
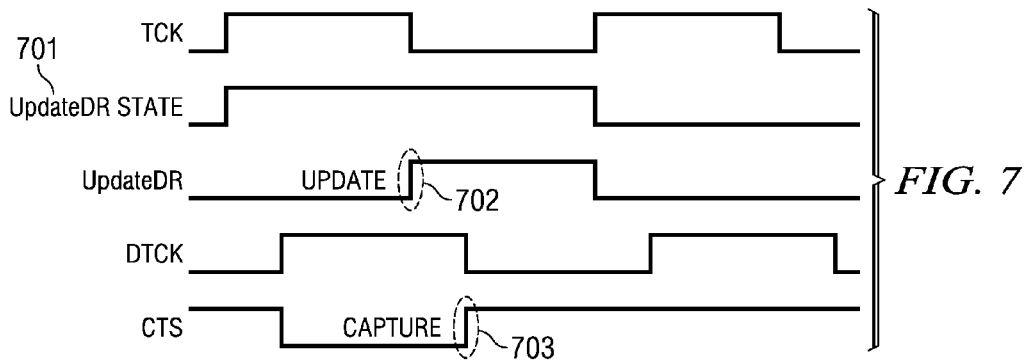
FIG. 7
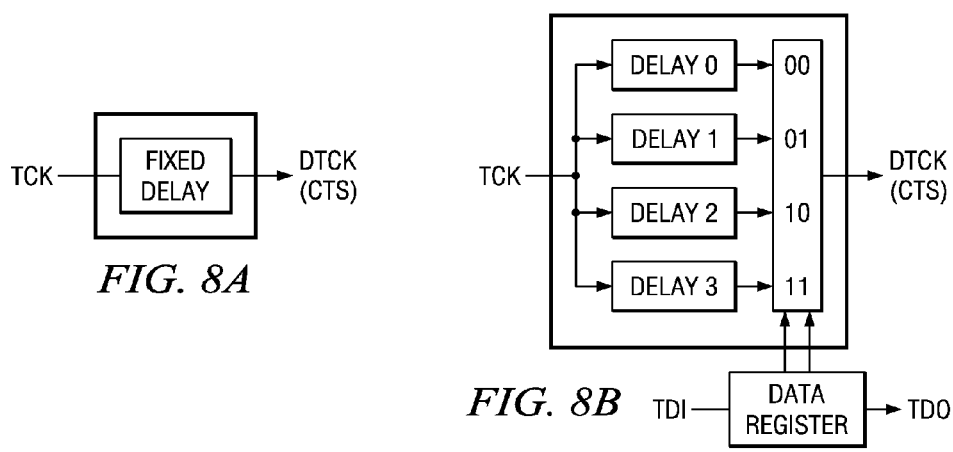
FIG. 8A
FIG. 8B

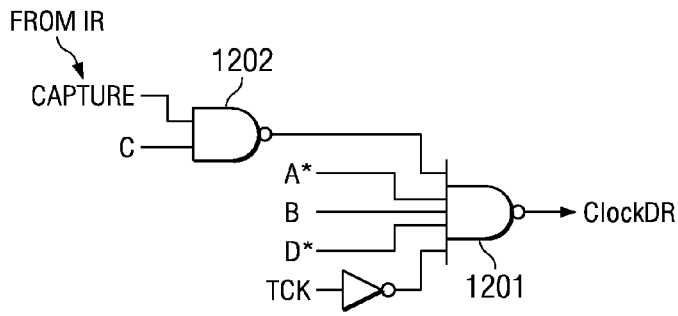

FOR EXTEST, CAPTURE=0

| D C B A | TAP STATE | ClockDR |
|---------|-----------|---------|
| 0 0 0 0 | Exit2DR | OFF |
| 0 0 0 1 | Exit1DR | OFF |
| 0 0 1 0 | ShiftDR | ON |
| 0 0 1 1 | PauseDR | OFF |
| 0 1 0 0 | SelectIR | OFF |
| 0 1 0 1 | UpdateDR | OFF |
| 0 1 1 0 | CaptureDR | ON |
| 0 1 1 1 | SelectDR | OFF |
| 1 0 0 0 | Exit2IR | OFF |
| 1 0 0 1 | Exit1IR | OFF |
| 1 0 1 0 | ShiftIR | OFF |
| 1 0 1 1 | PauseIR | OFF |
| 1 1 0 0 | RTIdle | OFF |
| 1 1 0 1 | UpdateIR | OFF |
| 1 1 1 0 | CaptureIR | OFF |
| 1 1 1 1 | TLReset | OFF |

FOR "PROPAGATION-TEST", CAPTURE=1

| D C B A | TAP STATE | ClockDR |
|---------|-----------|---------|
| 0 0 0 0 | Exit2DR | OFF |
| 0 0 0 1 | Exit1DR | OFF |
| 0 0 1 0 | ShiftDR | ON |
| 0 0 1 1 | PauseDR | OFF |
| 0 1 0 0 | SelectIR | OFF |
| 0 1 0 1 | UpdateDR | OFF |
| 0 1 1 0 | CaptureDR | OFF ) — NO-OP |
| 0 1 1 1 | SelectDR | OFF |
| 1 0 0 0 | Exit2IR | OFF |
| 1 0 0 1 | Exit1IR | OFF |
| 1 0 1 0 | ShiftIR | OFF |
| 1 0 1 1 | PauseIR | OFF |
| 1 1 0 0 | RTIdle | OFF |
| 1 1 0 1 | UpdateIR | OFF |
| 1 1 1 0 | CaptureIR | OFF |
| 1 1 1 1 | TLReset | OFF |

*FIG. 12*

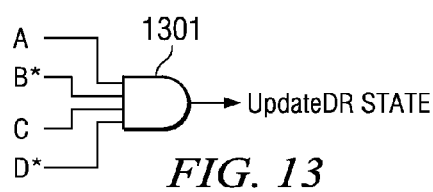

PROPAGATION TEST STROBE CIRCUITRY WITH BOUNDARY SCAN CIRCUITRY

CROSS-REFERENCE TO A RELATED PATENT

Certain aspects of this application relate to interconnect circuit testing as described in U.S. Pat. No. 5,056,094, Delay Fault Testing Method and Apparatus.

This application is a divisional of application Ser. No. 11/369,739, filed Mar. 7, 2006, now U.S. Pat. No. 7,269,769, issued Sep. 11, 2007;

Which is a divisional of application Ser. No. 10/364,100, filed Feb. 11, 2003, now U.S. Pat. No. 7,073,111, granted Jul. 4, 2006;

Which claims priority under 35 USC § 119(e)(1) of Provisional Application No. 60/387,043, filed Jun. 10, 2002.

BACKGROUND OF THE INVENTION

This application relates generally to the testing of high speed DC and AC coupled interconnect circuits located between integrated circuits by extending the instruction set and architecture of the IEEE 1149.1 TAP and Boundary Scan Standard (JTAG).

The bandwidth of digital signal communication between integrated circuits on boards is increasing. New higher speed digital interconnect circuit technologies are being developed to support this need. The traditional JTAG (i.e. IEEE 1149.1 standard) boundary scan architecture has limitations that hinder it from being able to test these higher speed digital interconnect circuits.

Testing of high speed DC and AC coupled interconnect circuit between integrated circuits by JTAG is restricted due to limitations in the way the JTAG architecture performs interconnect circuit testing. Growing use of these high speed interconnect circuit will require extensions to JTAG in order to achieve reliable testing of these interconnect circuits.

An AC-Extest Working Group has done some work in addressing the testing of high speed DC and AC coupled interconnect circuits or networks. Reports of their work can be obtained over the Internet at http://www.acextest.org/.

An article by Lofstrom, Keith, "Early Capture for Boundary Scan Timing Measurements," International Test Conference, Oct. 20-25, 1996, paper 15.3, pp. 417-422, discloses measuring analog waveforms and delays by an extension of the IEEE 1149.X standards. The extension captures samples data on a falling edge of TMS during the Update-DR state.

BRIEF SUMMARY OF THE INVENTION

The present disclosure provides extensions to the JTAG instruction set and architecture that are aimed at providing a solution to the testing of high speed IC to IC interconnect circuits. The solution maintains the basic operation of JTAG such that pre-existing instruction and architectural operations are not disturbed by the extensions of the present disclosure.

A Propagation Test instruction is added to the standard JTAG instruction set to test the propagation of a signal from a device output to a device input through an AC or DC coupled interconnect circuit. This instruction uses an additional clock signal, capture test strobe (CTS), within the JTAG architecture. Conventional input and output boundary scan cells may be used. Minimal additional circuitry is added to the Test Access Port. The CTS strobe causes the boundary scan input cells to capture data much earlier than the normal capture that occurs in the Capture-DR state of the JTAG protocol. The capture of data that normally would occur during the later Capture-DR state is forced by the Propagation Test instruction to be a no-operation NO-OP state. This prevents the earlier captured data from being overwritten by the normal capture operation.

A Decay Test instruction enables testing of the decay of a signal propagated from a device output to a device input through an AC coupled interconnect circuit. The Decay Test instruction operates identically to the Propagation Test instruction, with the exception that the Decay Test instruction allows normal capture of data in the Capture-DR state instead of forcing a no-operation state. Conventional output boundary scan cells may be used and modified input boundary scan cells must be used. Some additions are made to the TAP of the Propagation Test instruction. One scan data bit indicates a circuit passing the decay test with one logic state and failing the test with the opposite logic state.

A Cycle Test instruction enables testing of signal cycles propagated from a device output to a device input through an AC or DC coupled interconnect circuit. The Cycle Test instruction operates the output boundary scan cells to output alternating or toggling signals to the input boundary scan cells of the input device. Modified output boundary scan cells are required. The input boundary scan cells of the Decay Test instruction are used with additional circuitry. The TAP also requires additional circuitry over that required for the Decay Test instruction.

BRIEF DESCRIPTION OF THE VIEWS OF THE DRAWINGS

FIG. 4 is a block diagram of an AC interconnect circuit Propagation Test operation according to the present disclosure and a timing diagram.

FIG. 5 is a block diagram of the basic JTAG architecture of an integrated circuit.

FIG. 6 is a block diagram of an improvement to the basic JTAG architecture to allow the Propagation Test instruction of the present disclosure.

FIG. 7 is a timing diagram of the Propagation Test instruction of the present disclosure.

FIG. 8A is a block diagram of a first implementation example of a delay circuit of the present disclosure.

FIG. 8B is a block diagram of a second implementation example of a delay circuit of the present disclosure.

FIG. 12 is a block diagram of a modification of the conventional TAP Clock-DR gating circuit to support the Propagation Test instruction of the present disclosure.

FIG. 13 is a block diagram of an Update-DR state detection circuit added to the TAP to support the Propagation Test of the present disclosure.

DETAILED DESCRIPTION OF THE INVENTION

Figure 1:
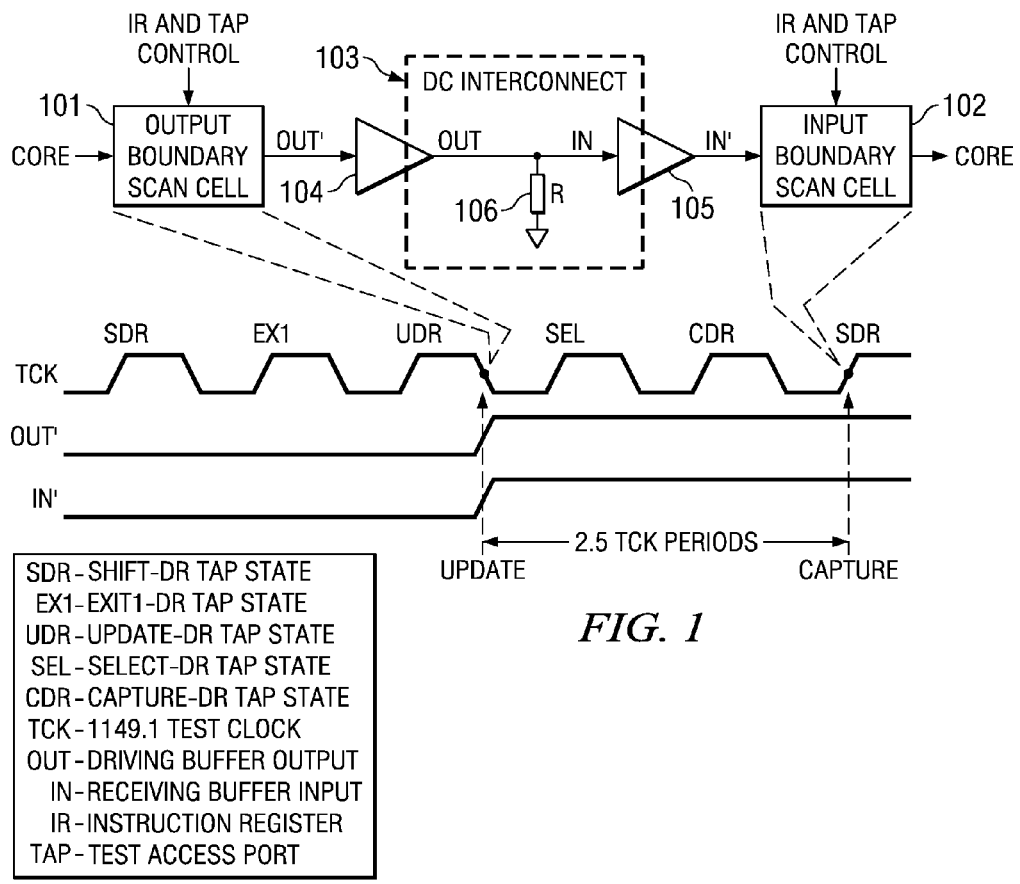
FIG. 1 is a block diagram of a conventional JTAG interconnect circuit test operation and related timing diagram.

FIG. 1 illustrates a DC interconnect circuit 103 being tested using the existing JTAG standard. The DC interconnect circuit 103 includes a termination element (i.e. pull down resistor 106). Many other configurations of termination elements in DC interconnect circuits are possible. In functional mode, a functional signal from a core circuitry is output from a first IC, passes through a JTAG boundary cell 101 of the first IC, and through output buffer 104 of the first IC. The functional signal is transmitted through an external DC interconnect circuit 103 to a functional core circuitry input of a second IC, via input buffer 105 and JTAG boundary cell 102 of the second IC.

The JTAG boundary cells are transparent during functional mode, which is achieved by loading a Bypass instruction into the instruction registers (IR) of the JTAG architectures of the first and second ICs. However, when an Extest instruction is loaded into the instruction registers (IR) of the JTAG architectures, the boundary cells are controlled by the JTAG test access port (TAP) and instruction register (IR) to operate independent of the IC's core circuitry to allow testing of the DC interconnect circuit. The Extest instruction and its operation within the JTAG architecture is well known, and details are provided in the IEEE 1149.1 standard document.

The timing diagram of FIG. 1 is provided for the purpose of illustrating the operation of the JTAG Extest operation occurring on the DC interconnect circuit 103. The timing diagram indicates state movements of the JTAG TAP controller during rising test clock (TCK) edges. The operation of the TAP controller is well known and details are provided in the IEEE 1149.1 standard document.

In the timing diagram, the Extest operation is seen to include the steps of shifting data during the Shift-DR (SDR) TAP state, then updating data during the Update-DR (UDR) TAP state, then capturing data at the end of the Capture-DR (CDR) TAP state at the transition into the Shift-DR (SDR) TAP state. The data is updated from boundary cell 101 on the falling edge of TCK in the Update-Dr state as indicated and is captured in boundary cell 102 at the end of the Capture-DR state, on the rising edge of TCK, as indicated. The update and capture operations are separated by 2.5 TCK periods. This separation does not interfere with the Extest operation, since the data value updated and driven from the output (OUT') of cell 101 is held at the input (IN') of cell 102 beyond the capture operation of cell 102.

Thus the Extest instruction, by passing data values through the DC interconnect circuit, can test to see if it is structurally correct. However, the 2.5 TCK separation does not allow for delay testing of the DC interconnect circuit (i.e. testing that a signal updated from cell 101 is captured into cell 102 in a short amount of time).

Figure 2:
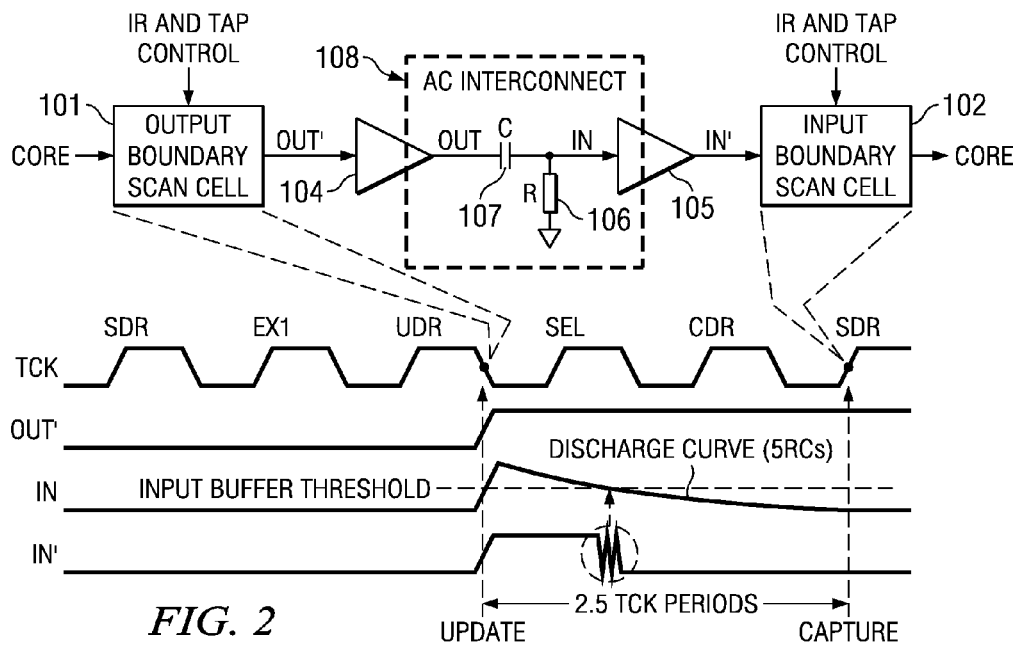
FIG. 2 is a block diagram of a first example limitation of the conventional JTAG interconnect circuit test operation and related timing diagram.

FIG. 2 illustrates the example of FIG. 1 with an AC interconnect circuit 108 used in place of the DC interconnect circuit 103. The AC interconnect circuit 108 includes the resistive termination element 106, as did DC interconnect circuit 102, along with a capacitor 107 located in series in the connection between the output (OUT) of buffer 104 and input (IN) of buffer 105. Capacitor 107 serves to block the DC component of the signal transmitted through the interconnect circuit while passing the AC component of the signal transmitted through the interconnect circuit. As with the DC interconnect circuit 102 example, many other types of resistive termination element connections are possible in AC interconnect circuit 108.

The timing diagram of FIG. 2 is used to indicate the problem the Extest instruction has in testing the AC interconnect circuit 108 of FIG. 2. As with the timing example of FIG. 1, data is shifted during the Shift-DR TAP state, then updated at the middle of the Update-DR TAP state, then captured at the end of the Capture-DR TAP state. In this example, a logic one is updated and output (OUT') from cell 101 on the falling TCK edge of the Update-DR state to drive the input (IN') of cell 102. However, the RC network in the AC interconnect circuit, after being charged by the logic one output from cell 101, starts to discharge as the pull down resistor 106 bleeds off the voltage from capacitor 107 to ground. After 5 RC time constants, the voltage present at input (TN') of buffer 105 will be approaching ground potential. It is assumed that the 5 RC time constants occur within the 2.5 TCK periods as shown in the FIG. 2 timing diagram. Thus the input (IN') to cell 102, while driven to a logic one after the update, will be driven to a logic zero by the time the capture operation occurs 2.5 TCKs later.

Figure 2A:
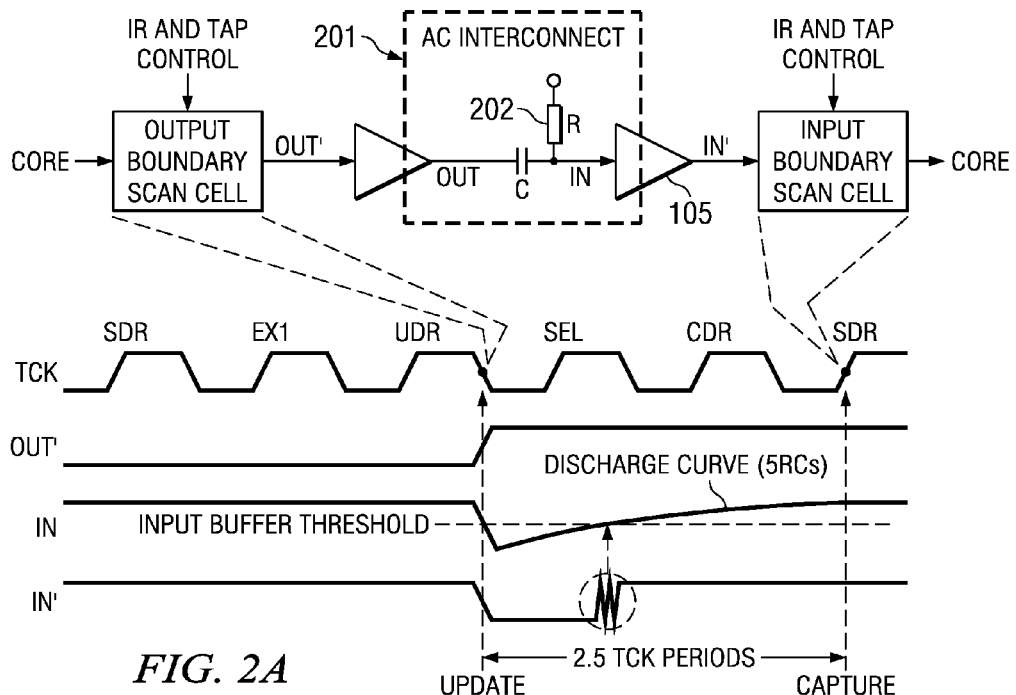
FIG. 2A is a block diagram of a second example limitation of the conventional JTAG interconnect circuit test operation and related timing diagram.

FIG. 2A illustrates an AC interconnect circuit 201 with a pull up element 202 that prevents testing using an updated logic zero signal for a reason similar to that illustrated in FIG. 2 with an AC interconnect circuit 108 having a pull down element 106 that prevents testing using an updated logic one test signal. That reason being that the AC interconnect circuit 201 will go from a driven logic zero state to a logic one state before the capture operation can occur 2.5 TCKs after the logic zero update operation.

From this description it is seen that AC interconnect circuits with small RC time constants will be rendered untestable by the JTAG Extest instruction operation. This problem is known and certain solutions are being developed under IEEE Standard P1149.6 (see Reference 1). Some of the solutions being looked at for IEEE P1149.6 require a significant amount of circuitry be added to the boundary cells of the JTAG architecture. The solution suggested by the present disclosure attempts to solve the problem without having to add much, if any, circuitry to the boundary cells of the JTAG architecture. Also the solution of this disclosure does not require any special manipulation of the external JTAG test bus, such as is required in the Lofstrom paper.

The solution of the present disclosure is based on use of three new test instructions that can be added to the JTAG instruction set: a Propagation Test instruction, a Decay Test instruction, and a Cycle Test instruction. These added instructions can be executed using normal operation of the external JTAG test bus.

Propagation Test Instruction Description:

The Propagation Test instruction enables testing the propagation of a signal from a device output to a device input through an AC or DC coupled interconnect circuit. While the devices described in this disclosure are shown as integrated circuits on a substrate, it should be understood that the devices could also be sub-circuit cores within an integrated circuit.

Figure 3:
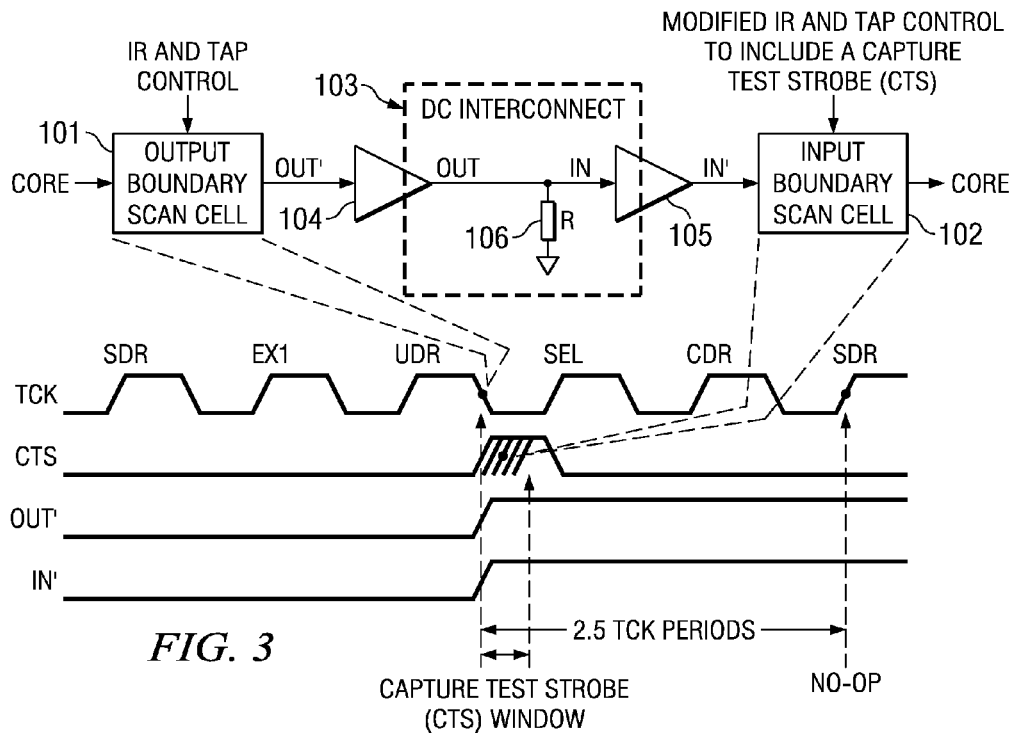
FIG. 3 is a block diagram of a DC interconnect circuit Propagation Test operation according to the present disclosure and a timing diagram.

FIG. 3 illustrates the DC interconnect circuit 103 being tested using the Propagation Test instruction. The Propagation Test instruction does not require any additional circuitry in the output boundary cells 101 or input boundary cells 102 of the JTAG architecture, i.e. conventional input and output cells may be used. The Propagation Test instruction uses an additional clock signal within the JTAG architecture, referred to as the capture test strobe (CTS) in the timing diagram of FIG. 3.

As seen in the timing diagram of FIG. 3, the Propagation Test instruction operates output cells 101 the same way as the Extest instruction of FIG. 1, i.e. data is shifted into the output cells during Shift-DR and updated from the output cells during Update-DR. The Propagation Test instruction does however modify the way the input cells 102 are controlled.

As seen the timing diagram of FIG. 3, the new capture test strobe (CTS) signal is shown to become active to control the input cells 102 within a window of time shortly after when data is updated from the output cells 101. Thus the CTS strobe causes input cells 102 to capture data much earlier than the normal capture that occurs at the end of the Capture-DR state. Further, the normal capture that occurs in the Capture-DR state is forced by the Propagation Test instruction to be a no-operation (NO-OP) during the Propagation Test instruction, to prevent the normal capture operation from overwriting the data captured by the CTS signal.

FIG. 4 illustrates the AC interconnect circuit 108 being tested using the Propagation Test instruction. Again, as seen the timing diagram of FIG. 4, the new capture test strobe (CTS) signal is shown to become active to capture data into the input cells 102 within a window of time shortly after when the data is updated from the output cells 101. Thus the capture test strobe (CTS) provides the ability to capture the propagated signal prior to it being discharged to ground via the RC network. Again, the Propagation Test instruction disables (i.e. causes a NO-OP TAP state) the normal JTAG capture operation that occurs 2.5 TCKs after the update to prevent overwriting the data captured by the CTS signal.

In both FIGS. 3 and 4 it is seen that the Propagation Test instruction provides a method of testing high speed interconnect circuits. The method is based on providing a CTS clock within a window of time shortly after the normal JTAG update operation occurs. The following description of FIGS. 5-13 will show one example of how to extend the JTAG architecture to include the CTS clock.

FIG. 5 illustrates a conventional JTAG architecture (less the bypass register) including a TAP controller 501, instruction register 502, and boundary register 503. The boundary register is connected to input and output buffers 504 and 505. The boundary register contains boundary cells, which can be Observe Only cells 506 or Observe and Control cells 507. The IN/IN' and OUT/OUT' labeling conventions map into the previous examples. During JTAG Extest operations, the TAP outputs Clock-DR, Update-DR, and Shift-DR signals to the boundary register 503 to allow for the previously mentioned shift, update, and capture steps mentioned in regard to the examples of FIGS. 1 and 2.

FIG. 6 illustrates the JTAG architecture of FIG. 5 modified to support the Propagation Test instruction. The modifications include adding CTS clock generation circuitry and changes to the instruction register 602 and TAP 601. The instruction register 602 is changed from the conventional instruction register 502 in that it includes the ability to recognize the Propagation Test instruction. When the Propagation Test instruction is loaded into the instruction register, new control signals are output from the instruction register on control bus 606. Control bus 606 carries these control signals to the CTS clock generation circuitry and to the TAP 601.

The CTS clock generation circuitry includes a delay circuit 603 for providing a delayed version of the TCK (DTCK) signal, gate 604 for gating the DTCK signal to produce the CTS signal, and gate 605 for gating the CTS signal to drive the boundary register 503 via the ClockDR' input, which produces the aforementioned early capture strobe. Gate 605 also allows the Clock-DR TAP state signal to conventionally drive the Clock-DR' input of the boundary register.

When the Propagation test instruction is loaded into the instruction register, a capture test strobe enable (CTSENA) signal from bus 606 becomes active to gate the DTCK signal to the CTS signal, whenever the TAP is in the Update-DR state. To indicate when the TAP is in the Update-DR state, an Update-DR state output signal is added to the TAP 601 and input to gate 604. Circuitry added to the TAP to indicate when the TAP is in the Update-DR state is shown in FIG. 13. To allow the conventional capture operation that occurs during the Capture-DR state to be forced to a No-Op as shown in FIGS. 3 and 4, a Capture signal is input to the TAP from control bus 606 while the Propagation Test instruction is the current instruction. The Capture signal and the added TAP circuitry it requires will be described later in regard to FIGS. 11 and 12.

FIG. 7 illustrates the timing during the Propagation Test instruction. Whenever the TAP enters the Update-DR state, the Update-DR state indicator 701 goes high, which along with the CTSENA signal gates DTCK to CTS. On the falling edge of TCK during the Update-DR state, the conventional Update-DR clock 702 occurs causing output boundary cells 101 of FIGS. 3 and 4 to output data onto the DC/AC interconnect circuits. Following the Update-DR clock, the CTS clock 703 occurs as a result of the DTCK signal. The capture test strobe window of FIGS. 3 and 4 is defined by the time between the rising edge of the Update-DR clock 702 and the rising edge of the CTS clock 703.

Figure 8C:
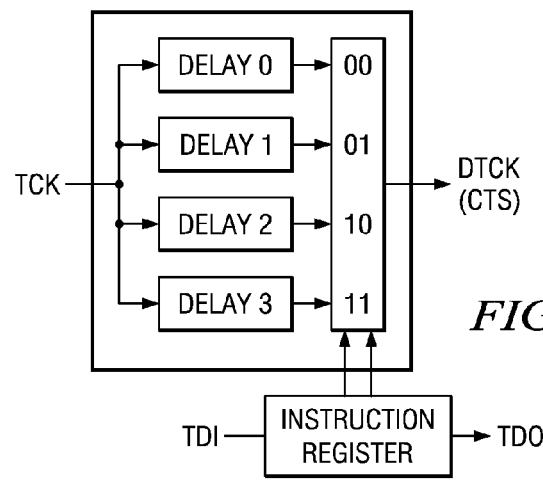
FIG. 8C is a block diagram of a third implementation example of a delay circuit of the present disclosure.

FIGS. 8A-D illustrate various examples of delay circuits 603. FIG. 8A illustrates a delay 603 circuit for providing a fixed DTCK delay. FIG. 8B illustrates a delay circuit 603 that is programmable using a JTAG data register scan operation to load a data register to provide a programmable DTCK delay. FIG. 8C illustrates a delay circuit 603 that is programmable using a JTAG instruction scan operation to the instruction register for providing a programmable DTCK delay. In FIGS. 8B and 8C each of the selectable delays 0-3 increasingly move the rising edge of CTS of FIG. 7 farther away in time from the rising edge of Update-DR of FIG. 7, which allows adjusting the CTS capture point as required to test a given DC/AC interconnect circuit.

Figure 8D:
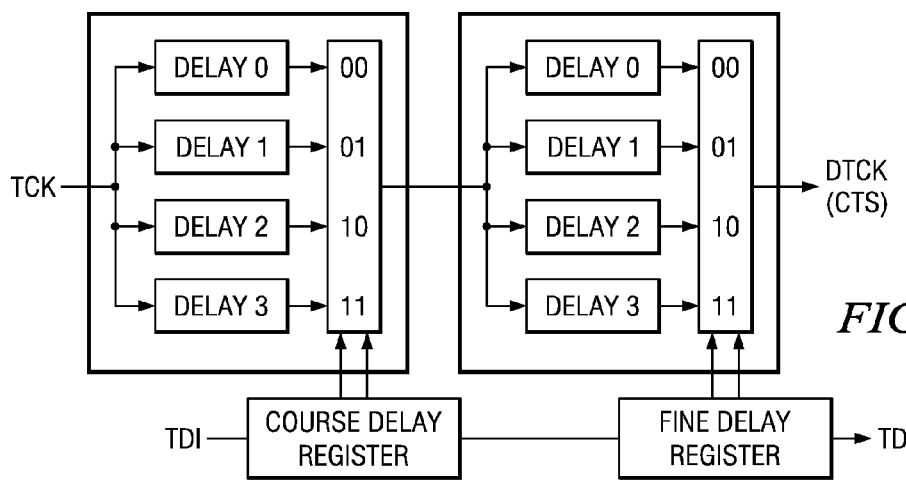
FIG. 8D is a block diagram of a third implementation example of a delay circuit of the present disclosure.
Figure 8E:
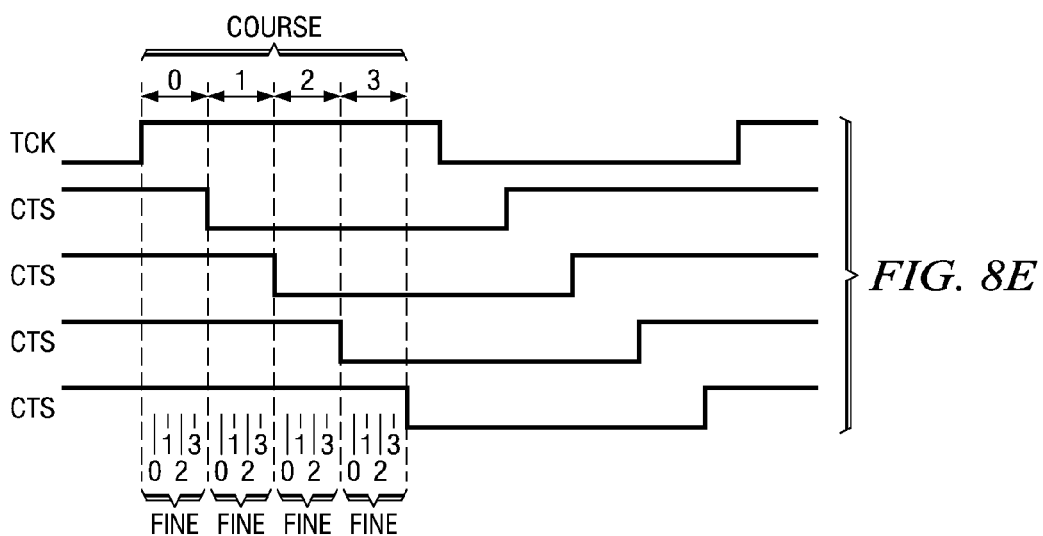
FIG. 8E is a timing diagram of fine and course delay programming of the delay circuit of FIG. 8D.

FIG. 8D illustrates a delay circuit 603 that includes course and fine CTS delay adjustment, to provide more control of the placement of the CTS capture point within the capture test strobe window of FIGS. 3 and 4. As seen in the timing diagram of FIG. 8E, the course delay adjustment can be programmed, via a JTAG scan operation, to provide a course setting of the CTS capture point (rising edge) with respect to the TCK. Further, a fine delay adjustment can be similarly programmed to provide a fine setting of the CTS capture point within any of the course setting capture points. Providing a more robust delay adjustment circuit 603 like shown in FIG. 8D allows for performing Propagation Test operations over extended DC/AC interconnect circuits, as may be used for example to connect boards together in a backplane environment.

Figure 9:
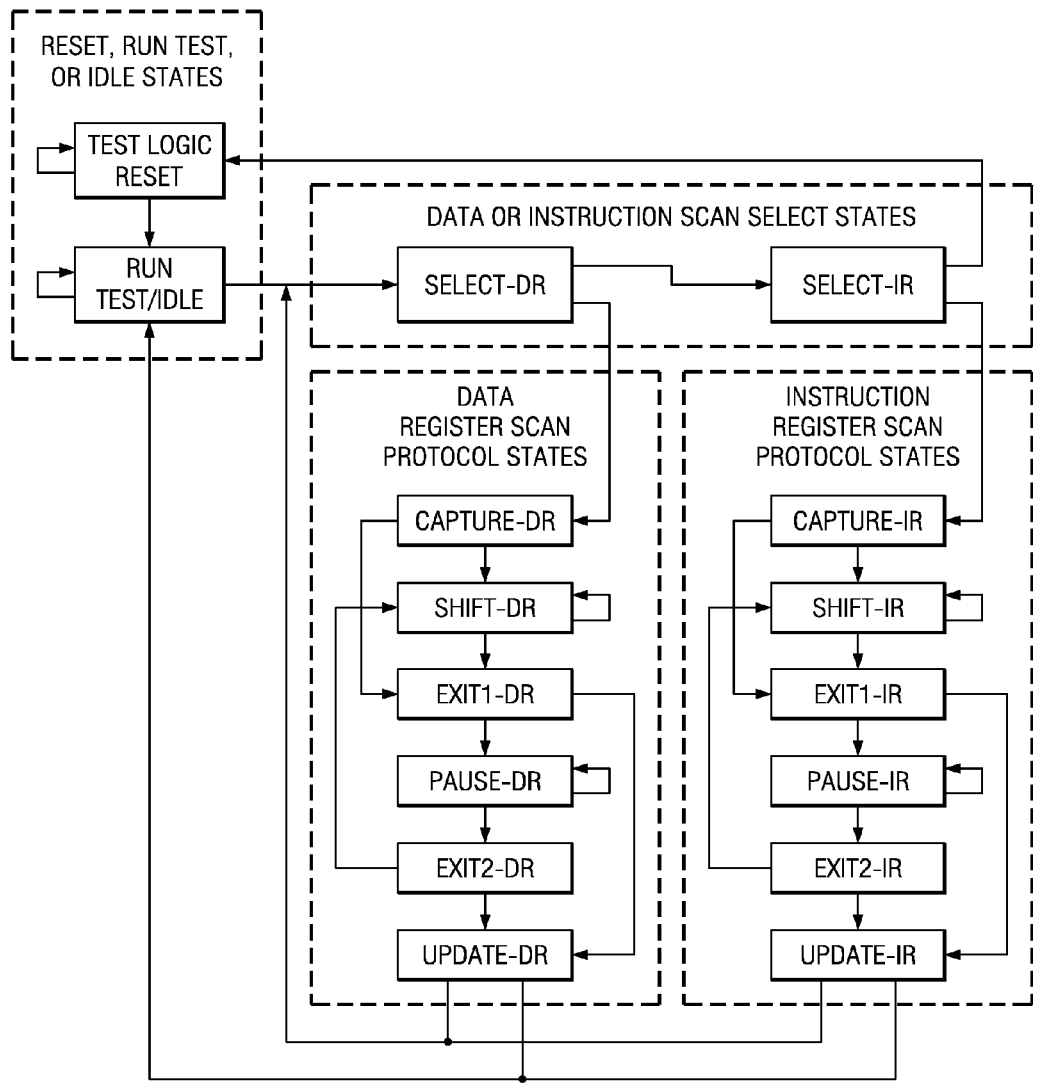
FIG. 9 is a conventional JTAG TAP controller state diagram.

FIG. 9 illustrates the conventional JTAG/1149.1 standard TAP controller state diagram, which is well known in the art.

Figure 10:
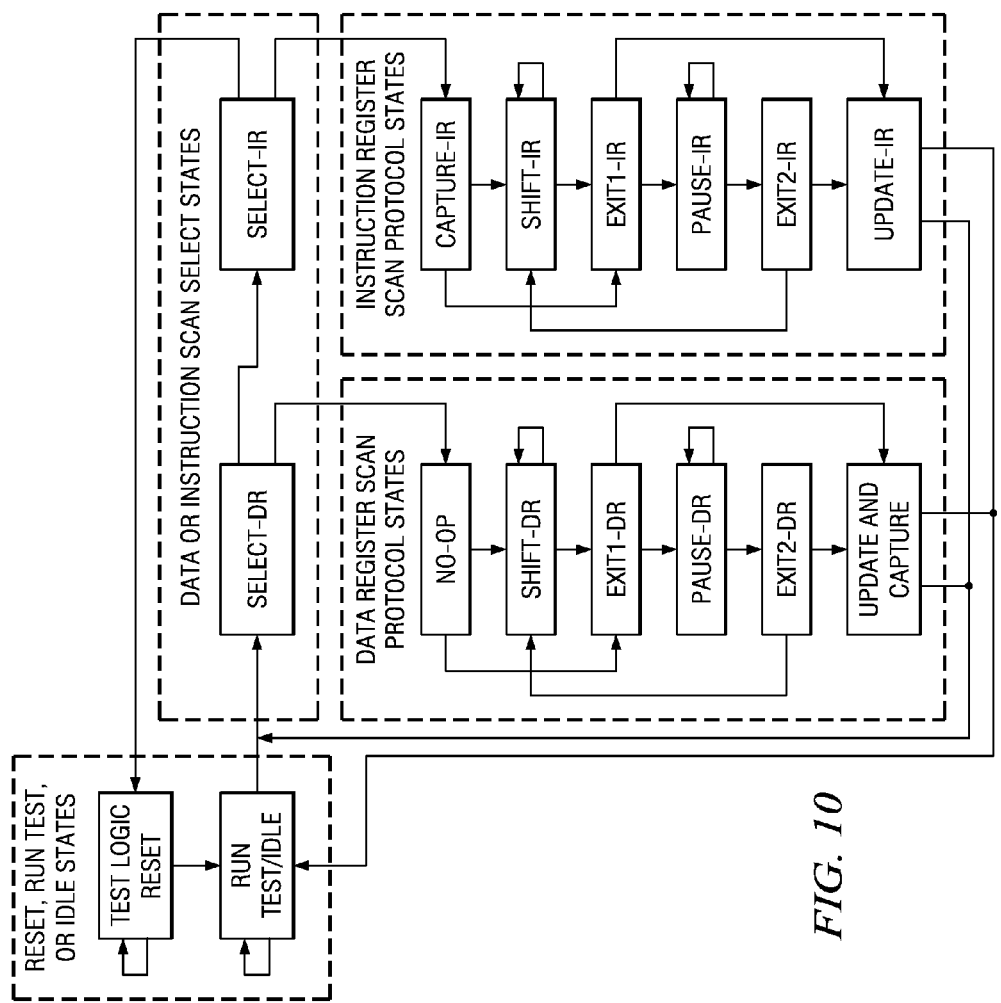
FIG. 10 is a state diagram indicating the changes provided by the Propagation Test instruction on certain states of the conventional JTAG TAP diagram.

FIG. 10 illustrates modifying the behavior of the TAP controller state diagram for the Propagation Test instruction to achieve the propagation test control described above in FIGS. 3, 4, and 7. When the Propagation Test instruction is loaded into the instruction register, control input to the TAP 601 from bus 606 causes the conventional Capture-DR state of the TAP in FIG. 9 to operate as a no-operation (No-Op) state in the TAP of FIG. 10, i.e. the capture operation conventionally performed in the Capture-DR state is disabled. This achieves the No-Op function shown in the timing diagrams of FIGS. 3 and 4, which, as mentioned, prevents overwriting data captured during the CTS window.

Further, when the Propagation Test instruction is loaded into the instruction register, control input to the CTS clock generation circuitry (CTSENA) from bus 606 along with an Update-DR state indicator signal output from TAP 601 causes a CTS clock output to occur when the TAP 601 is in the Update-DR state. The update operation performed in the Update&Capture state of FIG. 10 is the same as the conventional update operation performed in FIG. 9. The difference between the Update&Capture state of FIG. 10 and the Update-DR state of FIG. 9 is that the Update&Capture state enables a capture operation in addition to the conventional update operation. This achieves the activation of the CTS clock within the CTS window of the timing diagrams of FIGS. 3 and 4, which, as mentioned, provides for capturing data into input cells 102 shortly after when data is updated from output cells 101.

Figure 11:
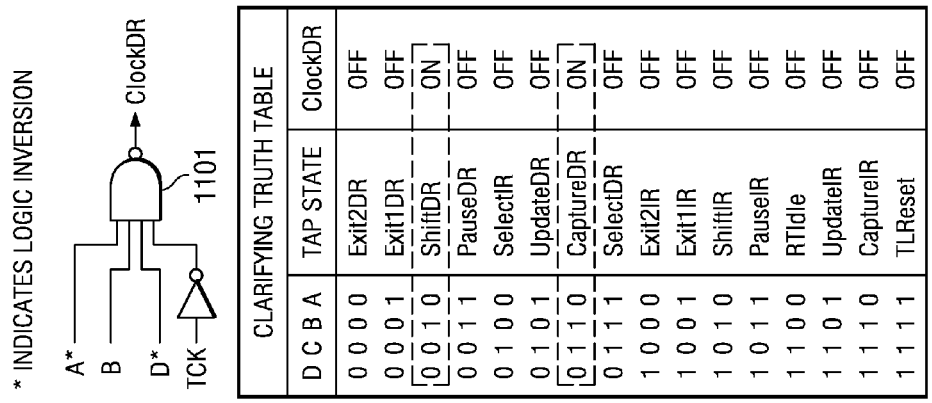
FIG. 11 is a block diagram of a conventional TAP Clock-DR gating circuit for producing Clock-DR signal during the Shift-DR and Capture-DR TAP states and clarifying truth table.

FIG. 11 illustrates the NAND gate 1101 depicted in FIG. 5.5 of the 1993 Revision of the IEEE Std 1149.1-1990 for producing the conventional Clock-DR TAP output signal. Also provided is a clarifying truth table, not from the 1149.1 standard, to illustrate how the NAND gate 1101 is enabled during the Shift-DR (DCBA=0010) and Capture-DR (DCBA=0110) states to allow the TCK signal to drive the Clock-DR signal. The truth table indicates that when the TAP is in the Shift-DR or Capture-DR state, the NAND gate 1101 receives appropriate ABD state inputs that allow the TCK to pass through the gate to drive the Clock-DR output of the gate. All other TAP states gate off or block the TCK from driving the Clock-DR output.

FIG. 12 illustrates one preferred way to modify the Clock-DR NAND gate 1101 of FIG. 11 to support the requirement to gate off the Clock-DR TAP output signal during the Capture-DR state (i.e. provide the No-Op of FIGS. 3 and 4) when the Propagation Test instruction is loaded into the instruction register. As seen in FIG. 12, the 5 input NAND gate 1201 replaces the 4 input NAND gate 1101 of FIG. 11. Also a 2-input NAND gate 1202 is added. The 2-input NAND gate 1202 inputs the C TAP state signal and a Capture control signal from bus 606 from the instruction register.

When the Propagation Test instruction is loaded into the instruction register, the Capture signal will be set high to allow the C TAP state to be input to the NAND gate 1201.

Inputting the C TAP state to NAND gate 1201 will cause NAND gate 1201 to pass TCK to Clock-DR during the Shift-DR state, but will block TCK from passing to Clock-DR during the Capture-DR state (see Propagation Test, Capture=1 Truth Table). This provides the No-Op state shown in the timing diagrams of FIGS. 3 and 4. When the conventional JTAG Extest instruction is loaded into the instruction register, the Capture signal will be set low to prevent the C TAP state from participating in the TAP state gating operation of gate 1201. Thus while Capture is low, NAND gate 1201 operates to pass TCK to Clock-DR during the Shift-DR and Capture-DR states, as does the NAND gate 1101 of FIG. 11 (see Extest, Capture=0 Truth Table).

FIG. 13 illustrates a gate 1301 added to the TAP 601 to indicate when the TAP 601 is in the Update-DR state (DCBA 0101). When in the Update-DR state, gate 1301 outputs a high on the Update-DR state signal which, as shown in FIG. 6, is input to gate 604 to participate, along with the CTSENA signal, in gating DTCK to CTS.

Decay Test Instruction Description:

The Decay Test instruction enables testing the decay of a signal propagated from a device output to a device input through an AC coupled interconnect circuit.

Figure 14:
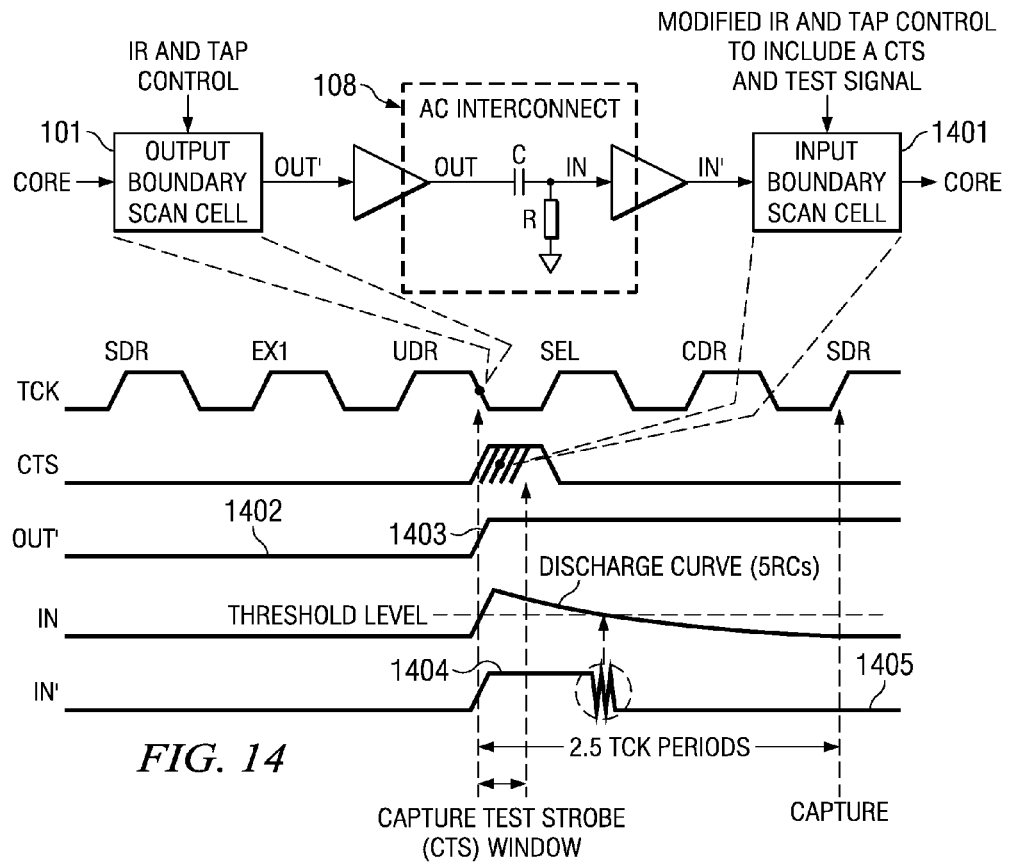
FIG. 14 is a block diagram of an AC interconnect circuit Decay Test operation according to the present disclosure and a timing diagram.

FIG. 14 illustrates the AC interconnect circuit 108 being tested using the Decay Test instruction. In the timing diagram of FIG. 14, the Decay Test instruction operates identically to the Propagation Test instruction timing diagram of FIGS. 3 and 4 with the exception that the Decay Test instruction allows the normal capture operation to occur at the end of the Capture-DR state instead of forcing a No-Op state, as occurs in the Propagation Test instruction. The Decay Test instruction does not require any modifications to conventional output boundary cells 101, but it does require modifications to conventional input boundary cells 102. Input cell 1401 indicates a modified input cell 102. The Decay Test instruction directly reuses most of the previously described JTAG circuit additions and modifications required by the Propagation Test instruction.

In the timing diagram of FIG. 14, data updated from output cells 101 on the falling edge of TCK in the Update-DR (UDR) state is captured into input cells 102 during the CTS window as previously described. However, unlike previously described, a second data capture operation occurs on the rising TCK edge at the end of the Capture-DR (CDR) state (2.5 TCKs after the update falling TCK edge).

From the above it is seen that the Decay Test instruction provides a test that includes the steps of, (1) applying (updating) a signal to the input of an AC network, (2) performing a first observation (capture) at the output of the AC network to determine transient response of the AC network to the applied signal, and (3) performing a second observation (capture) at the output of the AC network to determine the steady state response of the AC network to the applied signal.

In the timing diagram of FIG. 14, it is assumed that 2.5 TCK periods is sufficient time for the AC interconnect circuit to arrive at a steady state for the second observation (capture), i.e. the time of 2.5 TCK periods exceeds the time of 5 RC time constants. However, if 2.5 TCKs is not enough time to allow the AC network to arrive at a steady state, the TAP may be transitioned into the Run Test/Idle state (FIG. 9) to add more TCK periods, or the frequency of TCK may be reduced to provide longer TCK periods.

Figure 15:
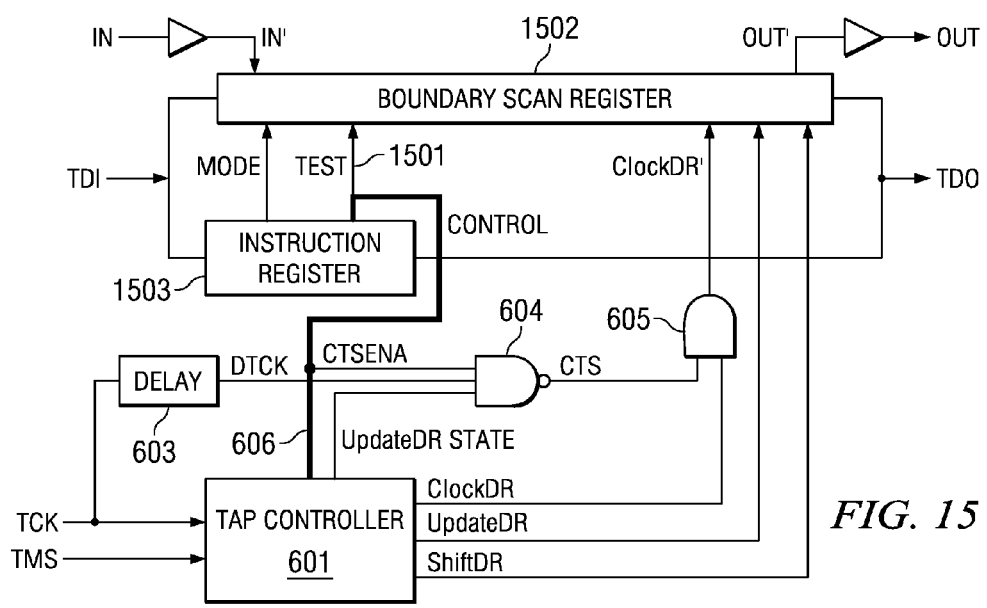
FIG. 15 is a block diagram of an improvement to the basic JTAG architecture to allow the Decay Test instruction of the present disclosure.

FIG. 15 illustrates the modifications to the JTAG architecture of FIG. 5 to achieve the Decay Test instruction. As can be seen by comparing the architectures of FIGS. 6 and 15, most of the modifications for the Decay Test instructions are provided by the Propagation Test instruction.

The differences between the Propagation Test instruction architecture and the Decay Test instruction architecture include; (1) the instruction register 1503 is designed to recognize the Decay Test instruction, and to output a new Test signal 1501 on control bus 606 when the Decay Test instruction is loaded, (2) the Test signal 1501 is input to input boundary cells 1401 of the boundary register 1502, and (3) the Capture signal of FIG. 12 from bus 606 to the TAP 601 is set low to force the operation shown in the "For Extest, Capture=0" Truth Table of FIG. 12 (i.e. the normal capture operation occurs during Capture-DR state).

Figure 16:
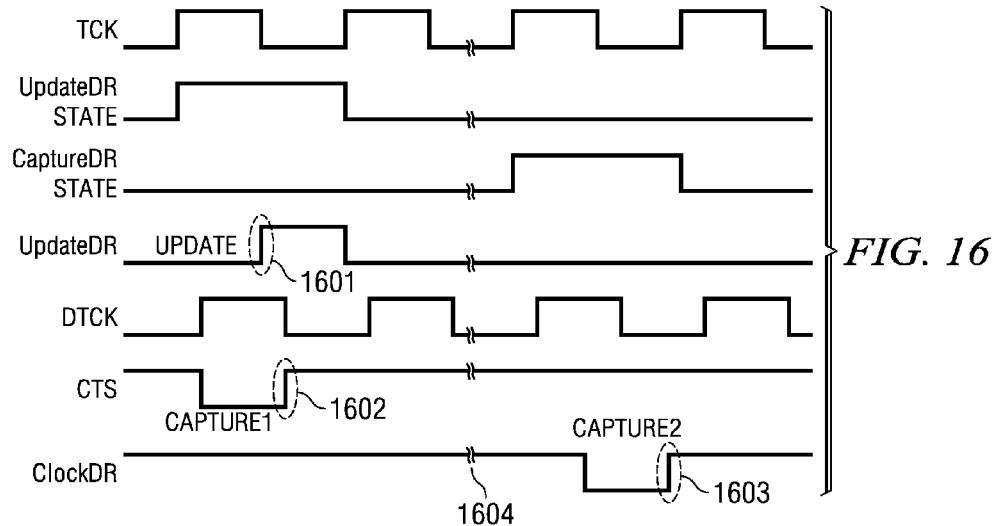
FIG. 16 is a timing diagram of the Decay Test instruction of the present disclosure.

FIG. 16 illustrates a timing diagram of the operation of the Decay Test instruction. As seen, during the Update-DR state an Update 1601 occurs followed shortly thereafter by a first Capture1 1602. A second Capture2 1603 occurs in the Capture-DR state 2.5 TCK or more after the update 1601. Time spacers 1604 indicate that the TAP may go directly from Update-DR to Capture-DR via Select-DR (see a TAP state diagram), or it may go from Update-DR to Run Test/Idle then onto Capture-DR via Select-DR to provide more TCK periods for the AC network to arrive at a steady state condition as described previously. As can be seen, the Decay Test timing diagram of FIG. 16 is the same as the Propagation Test timing diagram of FIG. 7, with the exception that a second capture 1603 occurs in FIG. 16.

Figure 17:
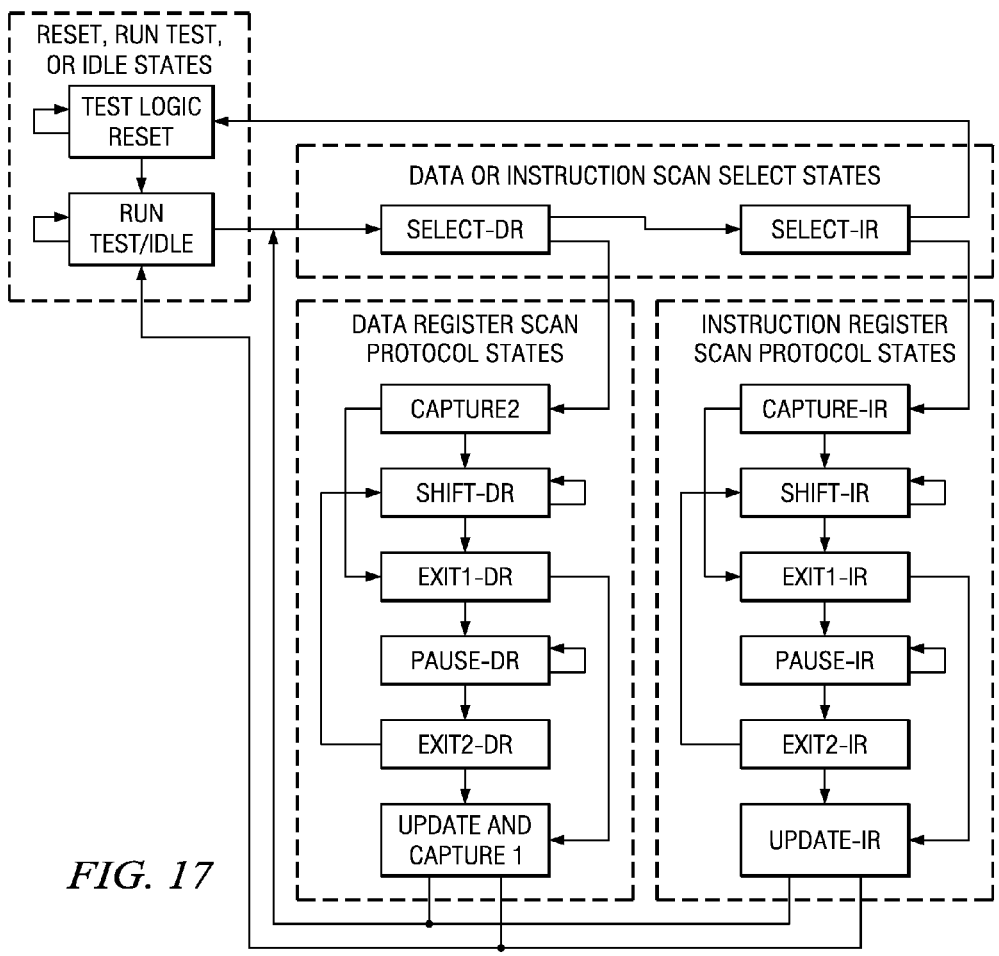
FIG. 17 is a flow chart of the impact of the Decay Test instruction on certain states of the conventional JTAG TAP diagram.

FIG. 17 illustrates how the Decay Test instruction modifies the behavior of the TAP controller state diagram to achieve the decay test control described above in connection with FIGS. 14, 15, and 16. The Capture2 state in FIG. 17 replaces but operates the same as the Capture-DR state shown in FIG. 9. The capture performed during the Capture2 state is the same as the second capture 1603 of the two-capture process used in the Decay Test. The Update&Capture1 state in FIG. 17 replaces the Update-DR state in FIGS. 9 and 10. The update operation performed in the Update&Capture1 state of FIG. 17 is the same as the update operation performed in the conventional update operation performed in FIGS. 9 and 10. There is really no difference between the Update&Capture1 state of FIG. 17 and the Update&Capture state of FIG. 10 other than the indication that the capture performed during the Update&Capture1 state is the first capture 1602 of the two-capture process used in the Decay Test.

In operation, when the Decay Test instruction is loaded in to the instruction register, the TAP sets the conditions for the test by passing to the Select-DR state, to the Capture2 state, to the Shift-DR state, to the Exit1-DR state, and to the Update&Capture1 state. Entering into the Update&Capture1 state performs the Update operation 1601 and Capture1 operation 1602 shown in FIG. 16. After performing the operations of the Update&Capture1 state, the TAP passes back to the Select-DR state and to the Capture2 state to complete the test. The Capture2 state provides the Capture2 1603 operation of FIG. 16. Time spacers 1604 indicate that the TAP may go directly from Update&Capture1 to Capture2 via Select-DR, or it may go from Update&Capture1 to Run Test/Idle then onto Capture2 via Select-DR to provide more TCK periods for the AC network to arrive at a steady state condition as described previously.

When the Decay Test instruction is loaded into the instruction register, control input to the TAP 601 from bus 606 (i.e. the Capture signal of FIG. 12) causes the TAP to perform a capture function in Capture2 state to achieve the second capture function 1603 shown in the timing diagrams of FIGS. 14 and 16. Further, when the Decay Test instruction is loaded into the instruction register, control input to the CTS clock generation circuitry (CTSENA) from bus 606 along with the Update-DR state indicator signal output from TAP 601 causes a CTS clock output to occur when the TAP 601 is in the Update-DR state.

Figure 18A:
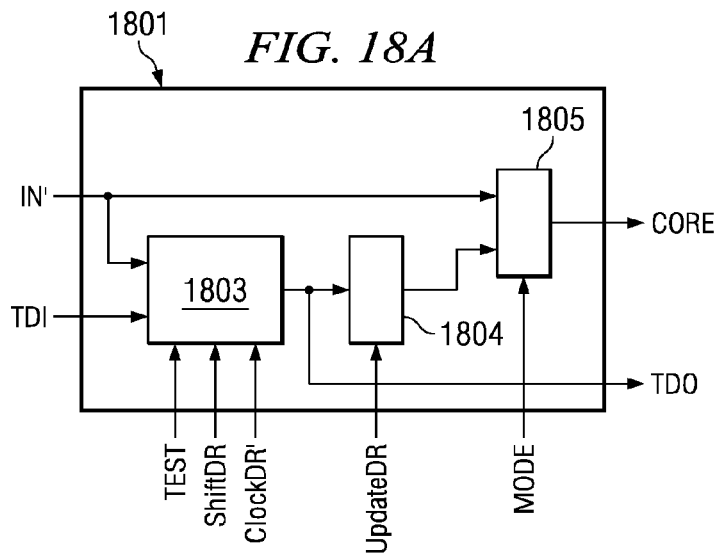
FIG. 18A is a block diagram of modifications to "Full" Input Boundary Scan Cells to enable the cells to execute the Decay Test instruction of the present disclosure.
Figure 18B:
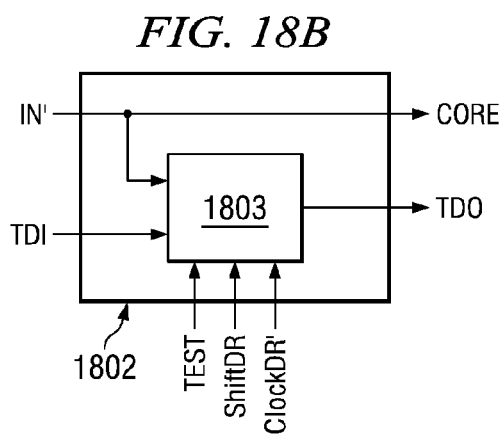
FIG. 18B is a block diagram of modifications to Observe Only Input Boundary Scan Cells to enable the cells to execute the Decay Test instruction of the present disclosure.

FIGS. 18A and 18B illustrate two types of modified input cells 1401 of FIG. 14 that can be used by the Decay Test instruction. FIG. 18A illustrates a full control and observe input boundary cell 1801 that has been modified to support the Decay Test instruction. The control and observe cell 1801 is similar to the conventional control and observe cell 507 of FIG. 5. One difference between cell 1801 and cell 507 is that the cell 1801 contains a circuit modification to the capture and shift portion 1803 of the cell. The update memory 1804 and output multiplexer (MUX) 1805 portion of the cell 1801 are the same as cell 507. Another difference between cell 1801 and cell 507 is that cell 1801 includes the new Test input signal 1501 from the instruction register bus 606 of FIG. 5, which is required by the Decay Test instruction. Also, cell 1801 is shown to be connected to the previously described Clock-DR' signal output from gate 605 of FIG. 6, instead of to the Clock-DR signal from the TAP of FIG. 5.

FIG. 18B illustrates an Observe Only input boundary cell 1802 that has been modified to support the Decay Test instruction. The Observe Only cell 1802 is similar to the conventional Observe Only cell 506 of FIG. 5. The differences between cell 1802 and cell 506 are that the cell 1802 contains the same circuit modification to the capture and shift portion 1803 of the cell as mentioned in the FIG. 18A cell, along with the previously mentioned new Test and Clock-DR' signals.

Both cells 1801 and 1802, as well as cells 506 and 507, may be used as input boundary cells on ICs. The difference between the control and observe cells 1801 and 507, and Observe Only cells 1802 and 506 is that the control and observe cells enable observing external IC data and controlling internal IC data, whereas the Observe Only cells only provide the observing of external IC data.

Figure 18C:
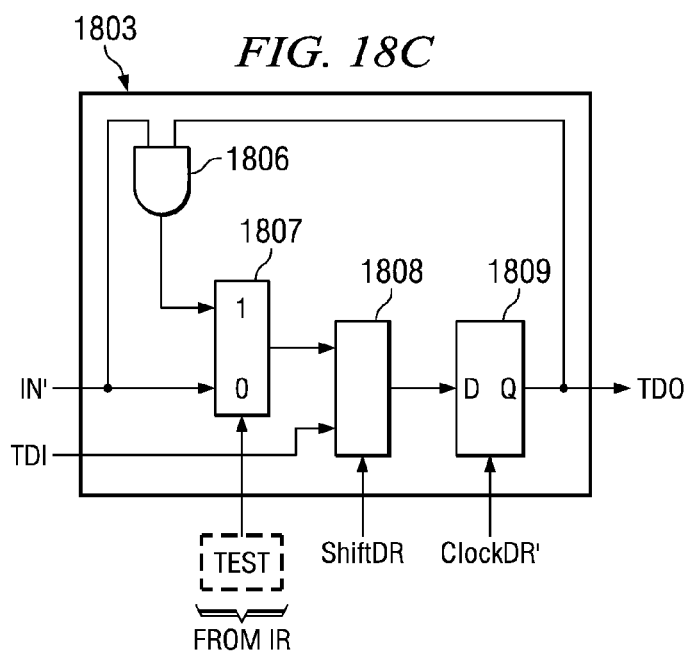
FIG. 18C is a block diagram of a circuit used in the block diagrams of FIGS. 18A and 18B.

FIG. 18C illustrates one preferred example implementation of the modified capture and shift circuit 1803. Circuit 1803 consists of an XOR gate 1806, MUX 1807, MUX 1808, and D-FF 1809. When the Test input is low, for example as a result of loading the conventional JTAG Extest instruction into the instruction register, circuit 1803 operates exactly like the conventional capture and shift circuit of FIG. 507. In this condition, IN' is captured into D-FF 1809 via MUXs 1807 and 1808, and is then shifted from TDI to TDO. When the Test input is set high as a result of the Decay Test being loaded into the instruction register, the operation of the circuit 1803 is modified to allow the output of the XOR 1806 to be captured into D-FF 1809. The output of the XOR is the sum of the present state of D-FF 1809 and the data value of the IN' input.

One sequence of test steps sets up and executes the Decay Test. These steps include; (1) load the Sample/Preload instruction to perform a preload scan operation to establish initial test data in the input 1801, 1802 and output 101 boundary cells connected to an AC interconnect circuit to be tested, and (2) load the Decay Test instruction to; (a) perform a scan operation to shift test data into the input and output cells, (b) perform an update 1601 operation to input data from the output cell to the AC interconnect circuit, (c) perform a first capture 1602 operation to load the input cell with the transient response output from the AC interconnect circuit, (d) perform a second capture 1603 operation to load the input cell with the steady state response output from the AC interconnect circuit, and (e) perform a scan operation to shift data out of the input and output cells.

In step 1 above, the data preloaded into the input and output cells will be data that initializes the cells for the first test data pattern to be transmitted through the AC interconnect circuit. For example, if the AC interconnect circuit 108 of FIG. 14 is being tested, the output cell will be initialized to output a logic zero to the AC interconnect circuit network 108 whenever the Decay Test is loaded in step 2. Outputting a logic zero to the AC network places the network in the expected steady state condition (i.e. logic zero at the network output). By establishing the steady state logic zero condition in the network, a logic one can be transmitted through the network from the output cell 101 to the input cell 1401 during the Decay Test operation.

The timing diagram of FIG. 14 illustrates the above process of, (1) preloading a logic zero to initialize the output (time 1402) from output cell 101 when the Decay Test is loaded, (2) scanning in an updating of a logic one (time 1403) from the output cell 101 to drive the network, (3) performing the first capture (time 1404) of the network transient output response to the logic one, then (4) performing the second capture (time 1405) to obtain the steady state output response of the network to the logic one.

The capture operation that occurs in D-FF 1809 of cell 1401 of FIG. 14 at the beginning of the Decay Test scan operation (i.e. during the first entry into the Capture2 state) is a don't care condition. This don't care condition is shifted out of D-FF 1809 as a logic zero is shifted in. The logic zero shifted into the D-FF 1809 establishes the required initial condition for the first capture operation performed in the Update&Capture1 state of FIG. 17.

Referring back to circuit 18C, by scanning the D-FF 1809 with a logic zero in the Shift-DR state prior to entering the Update&Capture1 state of FIG. 17, the first capture in the timing diagram of FIG. 14 (time 1404) that occurs during the Update&Capture1 state will load a logic one into D-FF 1809 from the XOR 1806. This logic one is the sum of the logic zero scanned into D-FF 1809 during Shift-DR and the transient logic one from the AC network at IN'. The second capture in the timing diagram of FIG. 14 (time 1405) that occurs during the Capture2 state will also load a logic one into D-FF 1809 from XOR 1806. This logic one is the sum of the logic one captured in D-FF 1809 during the first capture and the steady state logic zero from the AC network at IN'. During the Shift-DR state that follows the Capture2 state, the captured logic one is shifted out of D-FF 1809 for inspection.

If a logic one is shifted out of D-FF 1809, the test passes since that logic value verifies that the above described transient logic one was captured by the first capture operation and a steady state logic zero was captured by the second capture operation. If a logic zero is shifted out of D-FF 1809, the test fails. The failure can be caused by either; (1) a logic zero was captured during the first capture operation (XOR=0), meaning that the AC network failed to properly transmit the logic one output (OUT') from cell 101 to IN' of FIG. 14, or (2) a logic one was captured during the second capture operation (XOR=0), meaning that the AC network failed to properly go to (i.e. discharge to) the expected logic zero steady state condition.

As described above, circuit 1803 is designed to capture a first and a second logic value and if the captured values are different, which indicates a pass, to scan out a logic one. However, if the first and second capture values are the same, which indicates a fail, circuit 1803 scans out a logic zero. It should be understood that circuit 1803 could be designed to scan out a logic zero for pass and a logic one for fail if desired. Further, other circuit designs could be used in place of circuit 1803 that could respond to first and second capture operations to indicate pass or fail conditions. Circuit 1803 is used primarily to teach that very little additional circuitry (i.e. XOR 1806 and mux 1807) need be added to conventional input boundary cells 1401 to achieve the desired pass or fail result of the Decay Test instruction.

As described, the AC interconnect circuit network 108 of FIG. 14 is tested by initializing the network to a steady state logic zero then passing a logic one through the network to see the network respond with a logic one transient signal followed by a logic zero steady state signal. It should be understood that other AC interconnect circuit networks may be tested by initializing the network to an appropriate steady state condition then passing a signal through the network to cause the network to respond with a transient representation of the signal followed by a return to the steady state condition of the network. For Example, the AC network 201 of FIG. 2A may be tested by initializing the network to a steady state logic one then passing a logic zero through the network to see the network respond with the logic zero transient signal followed by a logic one steady state signal.

Figure 19:
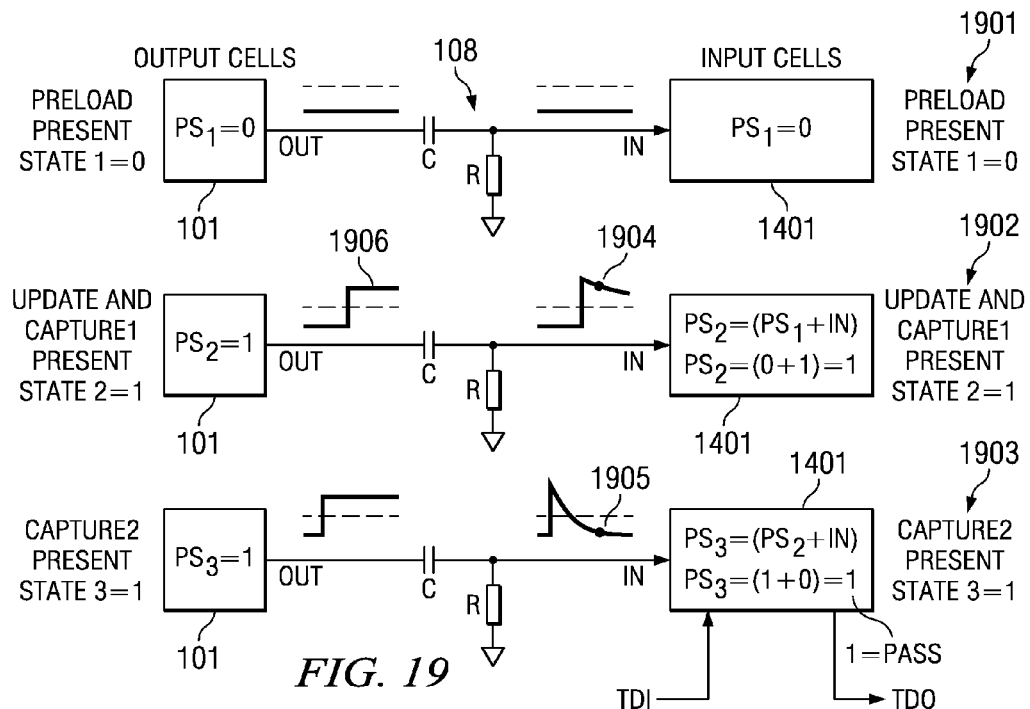
FIG. 19 is a block diagram of a first operation example of the Decay Test instruction.

FIG. 19 illustrates an example flow of the Decay Test instruction being used to test an AC coupled interconnect circuit network 108 located between an output cell 101 and input cell 1401. The AC coupled network 108 is assumed good and will pass the following Decay Test operation.

In FIG. 19, the progression of the Decay Test operation is shown to occur in three steps 1901, 1902, and 1903. Step one 1901 initializes the output 101 and input 1401 cells with present state data (logic zero) and places the network in the steady state logic zero condition. The steady state is the state the network's output will go to after a certain period of time, i.e. after 5 RC time constants. Step two 1902 updates at time 1906 a logic one signal from the output cell 101 and performs the first capture at time 1904 of the transient of the signal updated into input cell 1401. Step three 1903 performs the second capture at time 1905 of the steady state of the signal updated and shifts the test result from the input cell 1401 for inspection.

In step two 1902, the logic zero loaded into input cell 1401 during step one 1901 is summed, via XOR 1806, with the transient logic one input (IN) from the network, which causes a logic 1 to be captured at time 1904 into the input cell's D-FF 1809. In step three 1903, the logic one captured in input cell 1401 during step two 1902 is again summed, via XOR 1806, with the steady state logic zero input from the network to cause a logic 1 to again be captured at time 1905 into the input cell's D-FF 1809. The logic one shifted out of D-FF 1809 of input cell 1401, in step three 1903, indicates the network 108 passed the Decay Test operation.

Figure 20:
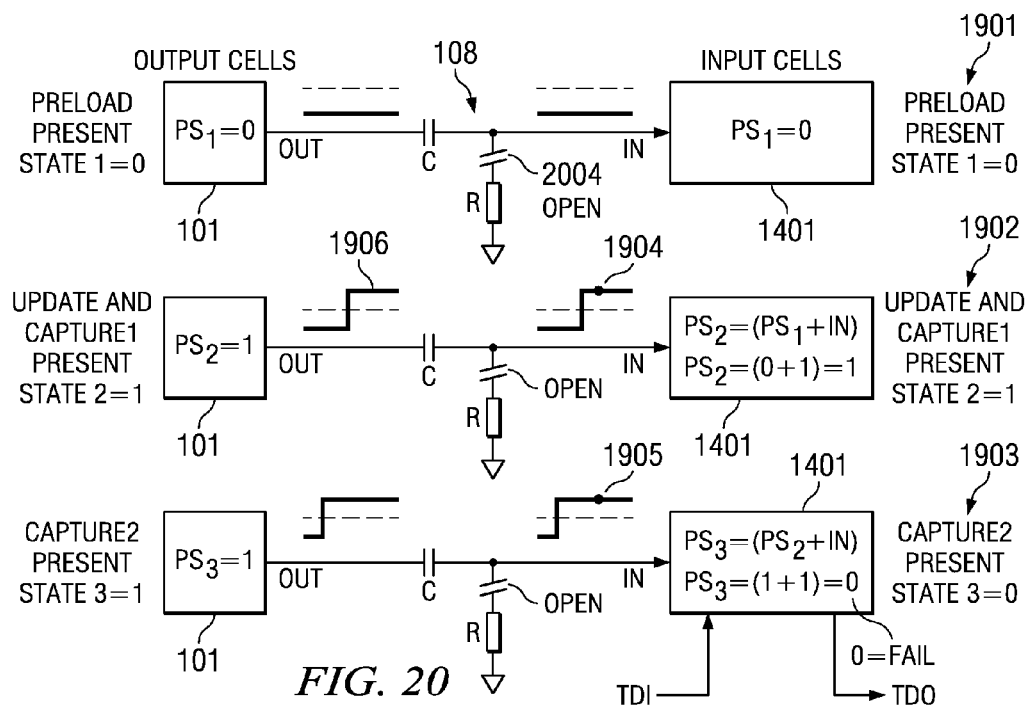
FIG. 20 is a block diagram of a second operation example of the Decay Test instruction.

FIG. 20 illustrates an example flow of the Decay Test instruction being used to test a faulty AC coupled interconnect circuit network 108 located between output cell 101 and input cell 1401. The fault in the AC coupled network 108 of FIG. 20 is the open circuit 2004 between pull down resister R and the input (IN) to input cell 1401. Other than the open circuit fault 2004, the AC network 108 of FIG. 20 is the same as the one in FIG. 19. In FIG. 20, the progression of the Decay Test operation again is shown to occur in three steps 1901, 1902, and 1903. Step one 1901 initializes the output 101 and input 1401 cells with present state data (logic zero) and places the network in the steady state logic zero condition. Step two 1902 updates at time 1906 a logic one signal from the output cell 101 and performs the first capture at time 1904 of the transient of the signal updated into input cell 1401. Step three 1903 performs the second capture at time 1905 of the steady state of the signal updated and shifts the test result from the input cell 1401 for inspection.

In step two 1902, the logic zero loaded into input cell 1401 during step one 1901 is summed, via XOR 1806, with the transient logic one input from the network, which causes a logic 1 to be captured 1904 into the input cell's D-FF 1809. In step three 1903, the logic one captured in input cell 1401 during step two 1902 is again summed, via XOR 1806, with the steady state input from the network, which in FIG. 20 is a logic one due to the open circuit at 2004. The second capture operation at time 1905 of step three causes a logic 0 to be captured into the input cell's D-FF 1809. The logic zero shifted out of D-FF 1809 of input cell 1401, in step three 1903, indicates the network 108 failed the Decay Test operation.

Figure 21:
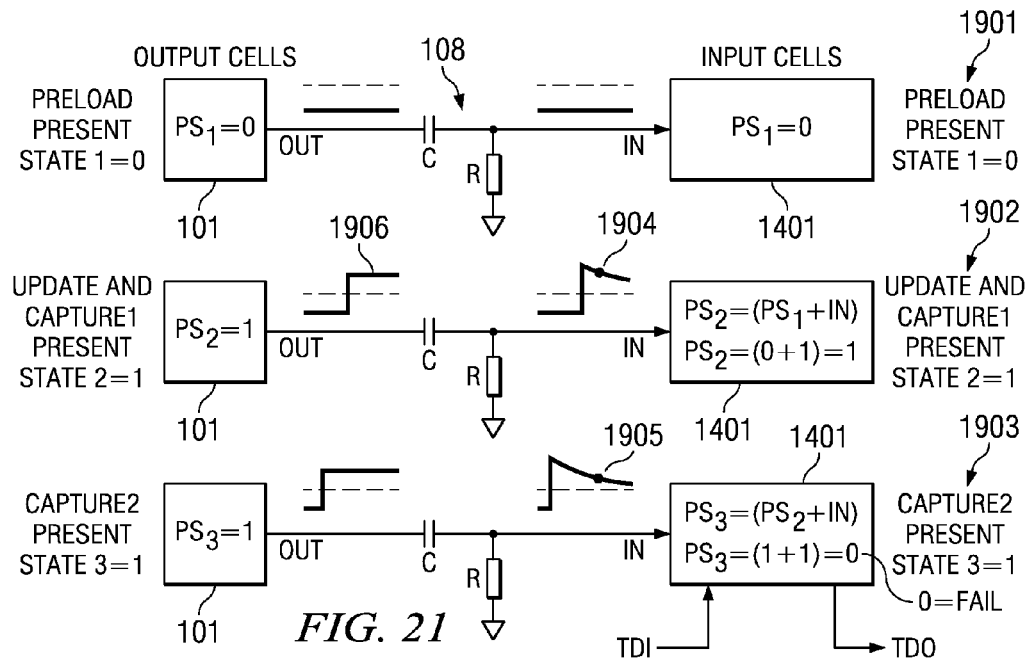
FIG. 21 is a block diagram of a third operation example of the Decay Test instruction.

FIG. 21 illustrates an example flow of the Decay Test instruction being used to test an AC coupled interconnect circuit network 108 located between output cell 101 and input cell 1401 that contains an incorrect R and/or C value. In this example, the result of the incorrect R/C value results in a network with a longer than expected RC time constant. Other than the incorrect R/C value, the AC network 108 of FIG. 21 is structurally correct.

In FIG. 21, the progression of the Decay Test operation again is shown to occur in three steps 1901, 1902, and 1903. Step one 1901 initializes the output 101 and input 1401 cells with present state data (logic zero) and places the network in the steady state logic zero condition. Step two 1902 updates at time 1906 a logic one signal from the output cell 101 and performs the first capture at time 1904 of the transient of the signal updated into input cell 1401. Step three 1903 performs the second capture at time 1905 of the steady state of the signal updated and shifts the test result from the input cell 1401 for inspection.

In step two 1902, the logic zero loaded into input cell 1401 during step one 1901 is summed, via XOR 1806, with the transient logic one input from the network, which causes a logic 1 to be captured 1904 into the input cell's D-FF 1809. In step three 1903, the logic one captured in input cell 1401 during step two 1902 is again summed, via XOR 1806, with the steady state input from the network, which in FIG. 21 is a logic one due to the incorrect R and/or C value. The second capture operation at 1905 of step three causes a logic 0 to be captured into the input cell's D-FF 1809. The logic zero shifted out of D-FF 1809 of input cell 1401, in step three 1903, indicates the network 108 failed the Decay Test operation.

The Decay Test operations of FIGS. 20 and 21 both produced failing outputs (logic zeros) from input cell 1401. To help determine the reason for the failing networks of FIGS. 20 and 21, an additional Decay Test operation can be performed. Determining the reason for a failure allows the failure to be identified to allow repairs to be performed more quickly. The additional Decay Test is the same as the other Decay Tests of FIGS. 20 and 21 with the exception that the second capture operation (at 1905) of the third step 1903 is delayed by either; (1) extending the TCK clock period, or (2) by transitioning the TAP into the Run Test/Idle state from the Update&Capture1 state before entering the Capture2 state. Both of these methods of delaying the occurrence of the second capture operation were previously described in regard to FIGS. 14 and 16.

Extending the time between the update at time 1906 and second capture at time 1905 will not eliminate the failure from showing up in the FIG. 20 example, since the open circuit 2004 prevents the RC network from discharging to a steady state. However, extending the time between the update at time 1906 and second capture at time 1905 will eliminate the failure from showing up in the FIG. 21 example by allowing more time for the RC network to discharge to its steady state. Thus the additional Decay Test operation can identify between the failures of FIGS. 20 and 21, facilitating the repair process.

The previously described Propagation Test can test the transient signals passed through the networks 108 of FIGS. 19-21 from output cell 101 to input cell 1401, but it cannot test for the return of the networks 108 to their steady state. Thus the advantage of the Decay Test instruction over the Propagation Test instruction is that it can test both the transient and steady state conditions of the networks 108.

Figure 22:
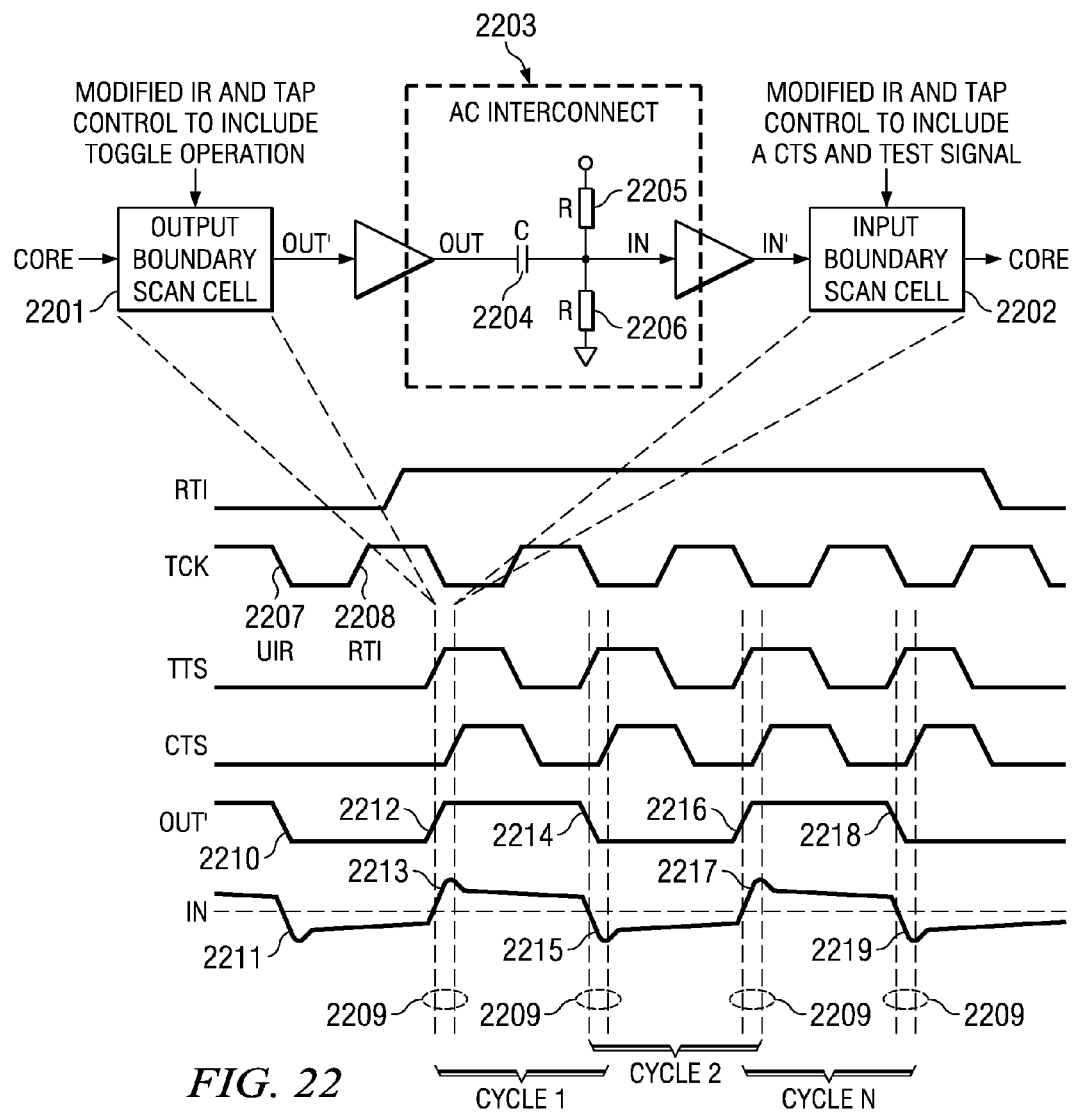
FIG. 22 is a block diagram of an AC interconnect circuit Cycle Test operation according to the present disclosure and a related timing diagram.

Cycle Test Instruction Description:

The Cycle Test instruction enables testing of signal cycles propagated from a device output to a device input through an AC or DC coupled interconnect circuit. FIG. 22 illustrates an AC interconnect circuit network 2203 being tested using the Cycle Test instruction. The AC network 2203 differs from the previous AC network 108 in that it contains two termination resistors 2205, 2206, one to supply or a first voltage and the other to ground or a second voltage less than the first. The steady state voltage of the node (IN) between the two resistors will be a voltage less than the first voltage but greater than the second voltage, as determined by the resistor values.

The Cycle Test instruction requires modifications to conventional input 102 and output 101 boundary cells. Output cell 2201 of FIG. 22 is modified to include a toggle output mode and input cell 2202 is modified to include the previous modification required by the Decay Test instruction, plus the addition of a pass/fail flag memory. These cell modifications will be described in more detail in regard to FIGS. 27 and 28.

In the timing diagram of FIG. 22, the Cycle Test instruction begins operating when the TAP enters the Run Test/Idle (RTI) state at time 2208, as indicated by the RTI signal going high. The RTI signal comes from the TAP and indicates when the TAP is in the Run Test/Idle state. The RTI signal will be described in FIG. 26A. Prior to entering the RTI state, a scan operation will have loaded the output 2201 and input 2202 cells with an initial logic state. The scan operation can be performed using the JTAG Sample/Preload instruction. In the timing diagram, this logic state, a logic zero, will be output at time 2210 from the output cell 2201 when the Cycle Test instruction is loaded into and updated from the instruction register on the falling edge of TCK in the TAP Update-IR (UIR) state at time 2207.

During the operation of the Cycle Test instruction, output cells 2201 are enabled to drive alternating (toggling) signals to the input (via OUT) of the network 2203, while the input cells 2202 are enabled to capture the transients of the alternating signals at the output (via IN) of the network 2203. In the timing diagram, the output (OUT') from the output cell 2201 toggles on the rising edge of a toggle test strobe (TTS) signal at times 2212, 2214, 2216, and 2218.

The TTS signal is a new signal, timed by TCK, that is added to the JTAG architecture to enable the Cycle Test instruction, as will be described in FIG. 23. As a consequence of the toggling output (OUT') from the output cell 2201, the input (IN) to the input buffer toggles at times 2213, 2215, 2217, and 2219. The input cell 2202 captures transient data inputs to the input cell 2202 on the rising edge of CTS during each toggle and capture window 2209.

The waveform of the IN signal in the timing diagram is representative of the type of network 2203 output that can be expected when toggling inputs are applied to the input of the network 2203. The dotted line running through the IN signal indicates the threshold point of the input buffer of FIG. 22. Thus at the beginning of the toggle and capture window 2209 of cycle 1, the input cell 2202 will capture a logic one transient at 2213, and at the beginning of the toggle and capture window 2209 of cycle 2, the input cell 2202 will capture a logic zero transient at 2215. As seen, during each toggle and capture window 2209, output data from the output cell 2201 changes and these changes are transmitted through the network 2203 to be captured by the input cell 2202. The toggle and capture windows 2209 continue to occur while the TAP is in the RTI state, enabling any number of toggle and capture window cycles to occur.

Figure 23:
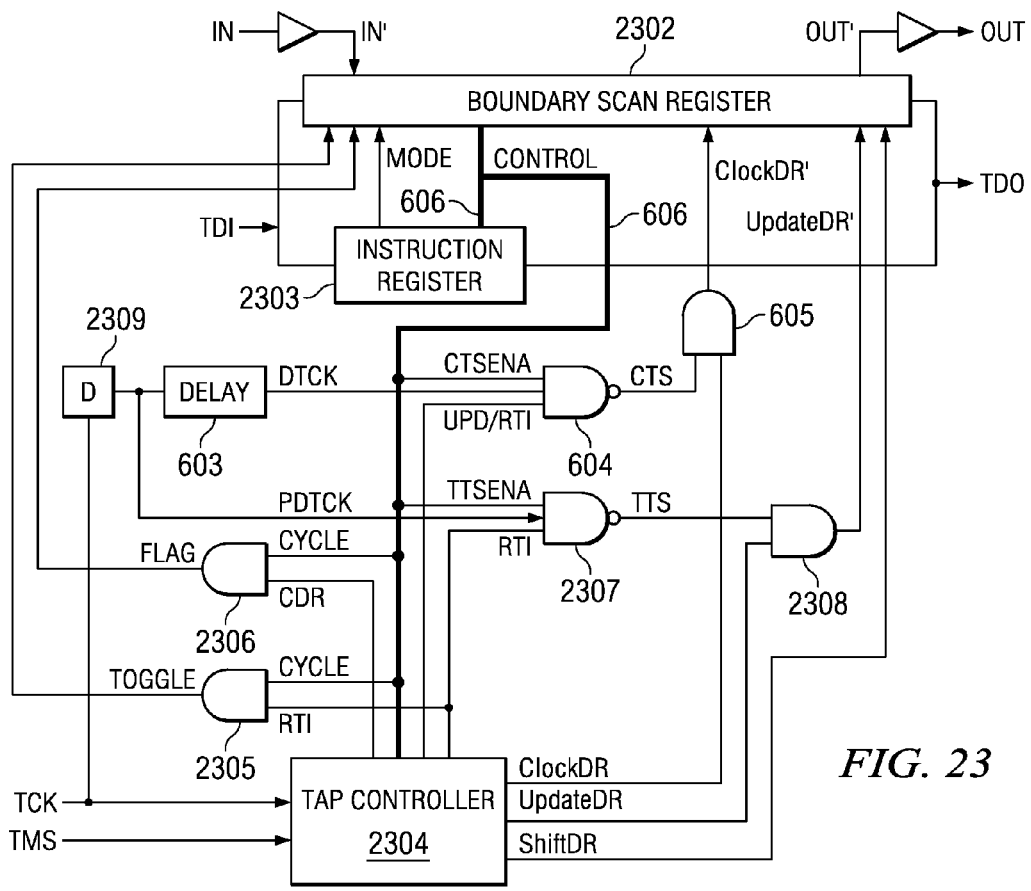
FIG. 23 is a block diagram of an improvement to the basic JTAG architecture to provide the Cycle Test instruction of the present disclosure.

FIG. 23 illustrates the modifications to the JTAG architecture of FIG. 5 to achieve the Cycle Test instruction. The Cycle Test modifications reuse the previously described CTS 604, 605 and Delay 603 circuitry. The new circuitry for the Cycle Test instruction includes; (1) an AND gate 2305 for producing a Toggle control signal to the boundary scan register 2302, (2) an AND gate 2306 for producing a Flag control signal to the boundary scan register, (3) a NAND gate 2307 and AND gate 2308 for producing a toggle test signal (TTS) to the boundary scan register, (4) a delay circuit 2309 for producing a pre-DTCK (PDTCK) signal to gate 2307, (5) the instruction register 2303 is designed to recognize the Cycle Test instruction and to output control signals (i.e. the previously described Test and CTSENA signals plus new signals Cycle and CTSENA) on bus 606 to enable the Cycle Test instruction, and (6) the TAP 2304 is modified to output the RTI signal and a UDR/RTI signal.

Figure 27A:
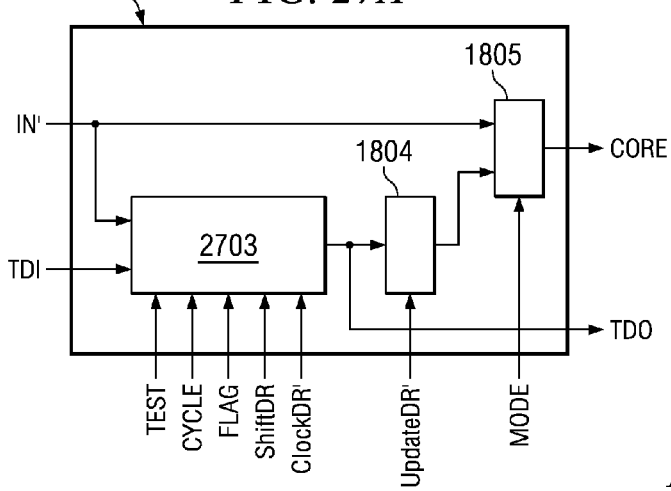
FIG. 27A is a block diagram of modifications to "Full" Input Boundary Scan Cells to enable the cells to execute the Cycle Test instruction of the present disclosure.
Figure 27B:
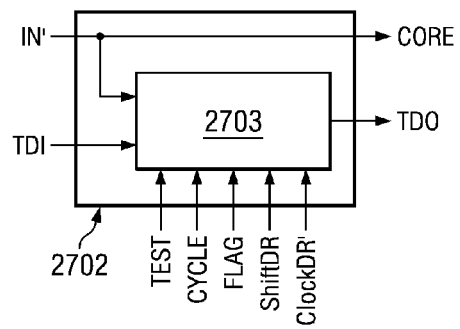
FIG. 27B is a block diagram of modifications to Observe Only Input Boundary Scan Cells to enable the cells to execute the Cycle Test instruction of the present disclosure.

Referring also to FIGS. 27A and 27B, the signals Test and Cycle from instruction register control bus 606, and the Flag signal from gate 2306 are input to the modified capture and shift circuit 2703 portion of the "Full" 2701 and Observe Only 2702 input cells of FIGS. 27A and 27B. Except for circuit 2703, the input cells 2701 and 2702 are the same as the input cells 1801 and 1802 of FIG. 18. Capture and shift circuit 2703 of FIG. 27 is similar to capture and shift circuit 1803 of FIG. 18 with the exception that circuit 2703 contains a Pass/Fail flag, consisting of a D-FF 2705 and an AND gate 2704, and a four input mux 2706 is used in place of the two input mux 1808. When Test, Cycle, and Flag signals are set low, circuit 2703 is programmed to operate in either the conventional JTAG capture and shift mode (for example the Extest instruction mode), or the Propagation Test instruction mode of the present disclosure. When the Test signal is high and the Cycle and Flag signals are low, circuit 2703 is programmed to operate in the Decay Test mode of the present disclosure.

When the Test signal is low and the Cycle and Flag signals are high, circuit 2703 is programmed to operate in the Cycle Test instruction mode of the present disclosure. Thus circuit 2703 represents one example implementation of a capture and shift circuit that is programmable for operating all the test instructions of the present disclosure, plus conventional JTAG test instructions. Note in FIG. 23 that if Cycle is low, Flag is forced low by gate 2306, but if Cycle is high, Flag follows the value of the TAP Capture-DR (CDR) state output.

When the Cycle Test instruction is shifted into and updated from the instruction register 2303 the Test signal to circuit 2703 remains low to allow the IN' input to pass through mux 1807 to mux 2706. Also, when the Cycle Test instruction is updated, the Cycle signal to circuit 2703 transitions from a low to a high to deactivate the Set input from D-FF 2705. While low, the Cycle signal forces (Sets) D-FF 2705 to a logic 1 condition, the pass state condition. Thus at the beginning of a Cycle Test instruction, D-FF 2705 will be set to the pass state. Prior to loading the Cycle Test instruction, D-FF 1809 will have been preloaded (by a Sample/Preload instruction) to an appropriate initial state for starting the Cycle Test instruction.

The appropriate initial state loaded into D-FF 1809 will be the opposite of the expected signal state received at the IN' input of circuit 2703 during the toggle and capture window 2209 of Cycle 1 of FIG. 22. As can be seen in circuit 2703, if the initial state in D-FF 1809 and the expected state received on the IN's input are opposite each other, XOR 1806 will output a logic 1 to be stored (in response to CTS on ClockDR') in pass/fail flag D-FF 2705, which indicates a pass. However, if the initial state in D-FF 1809 and the expected state received on the IN' input are the same, XOR 1806 will output a logic 0 to be stored in the pass/fail D-FF 2705, which indicates a fail and causes the pass/fail flag to latch up at a logic 0 fail state.

The toggle and capture window 2209 of Cycle 1 in timing diagram of FIG. 22 depicts the above initial test operation of XOR'ing a logic 1 from IN' with an initial logic 0 from D-FF 1809. During the next toggle and capture window 2209 of Cycle 2 the operation is repeated, this time by XOR'ing a logic 0 from IN' (toggled value) with a logic 1 stored into D-FF 1809 resulting from the logic 1 input at IN' during the initial test operation in Cycle 1. The process of XOR'ing inputs at IN' with contents of D-FF 1809 continues while the TAP is in the Run Test/Idle state. As long as the value at IN' is opposite the value in D-FF 1809, the pass/fail flag will continue to be loaded with the pass value (i.e. logic 1). Whenever, the value at IN' equals the value in D-FF 1809 the pass/fail flag will be loaded with the fail value (logic 0) and that fail value will be maintained until the end of the Cycle test.

Figure 28:
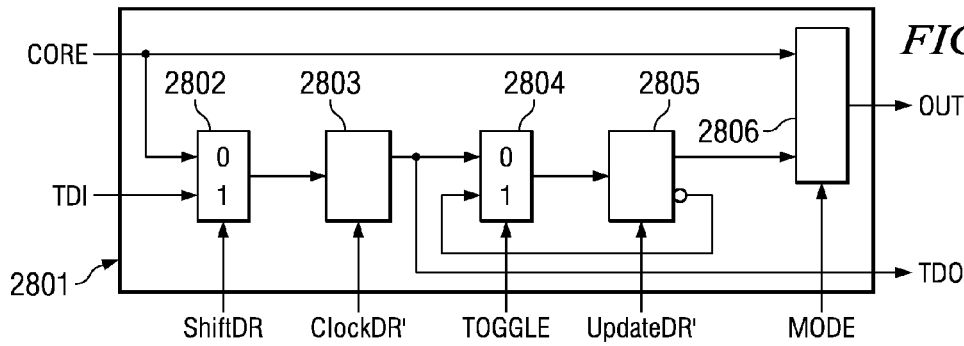
FIG. 28 is a block diagram of modifications to Output Boundary Scan Cells to enable the cells to execute the Cycle Test instruction of the present disclosure.

FIG. 28 illustrates a modified output cell 2801 of the boundary register 2302 that performs the toggle function that occurs in the toggle and capture window 2209 during Cycle Test. Output cell 2801 is one preferred implementation of the previously described output cell 2201. The modification includes inserting a 2 input mux 2804 between capture/shift D-FF 2803 and update D-FF 2805. One input of mux 2804 is connected to the output of D-FF 2803 and the other is connected to the inverted output of D-FF 2805. The output of mux 2804 is connected to the input of D-FF 2805. Mux 2804 is controlled by a Toggle signal input from gate 2305 of FIG. 23.

During Cycle Test instructions, the Cycle signal on bus 606 is high to enable the Toggle signal to follow the RTI signal output from TAP 2304. The RTI output signal from the TAP 2304 is set high when the TAP is in the Run Test/Idle state, as determined by gate 2601 of FIG. 26A which is added to TAP 2304. Whenever the TAP is in the Run Test/Idle state (RTI is high) and the Cycle Test instruction is the currently loaded instruction (Cycle is high) the Toggle signal will be set high. In addition to enabling the Toggle output of gate 2305, the RTI signal also enables the TTS clock output of gate 2307 and CTS clock output of gate 604.

Figure 26A:
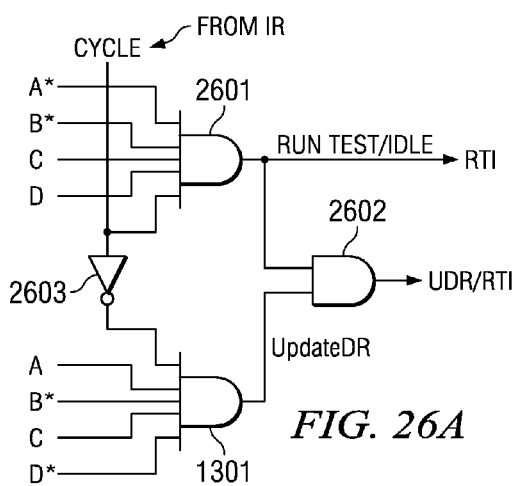
FIG. 26A is a block diagram of the circuitry added to the TAP for detecting the Run Test/Idle and Update-DR states to support the Propagation and Cycle Test instructions of the present disclosure.

In FIG. 26A, OR gate 2602 allows switching to occur between the RTI output of gate 2601 and the Update-DR (UDR) output of gate 1301. The switching is controlled by the Cycle signal. During Cycle Test instructions (Cycle is high), the UDR/RTI output of gate 2602 transmits the RTI signal to gate 604 to enable CTS clocks for cycle test operations during the Run Test/Idle state. During Propagation Test or Decay Test instructions (Cycle is low), the UDR/RTI output of gate 2602 transmits the UDR signal to gate 604 to enable CTS clocks for the propagation and decay test operations during the Update-DR state.

In FIG. 28, when Toggle is high and the Mode input is set to couple the output of D-FF 2805 to the OUT' output of the output cell 2801 via mux 2806, the OUT' output will toggle during each TTS clock input (via Update-DR') from gate 2307. When Toggle is low, mux 2804 couples the output for D-FF 2803 to the input of D-FF 2805 to allow conventional JTAG instruction (i.e. Extest) operations to occur in the output cell 2801. Thus the addition of mux 2804 makes the output cell 2801 programmable for either conventional JTAG instruction operation or for the Cycle Test instruction operation of the present disclosure.

Figure 27C:
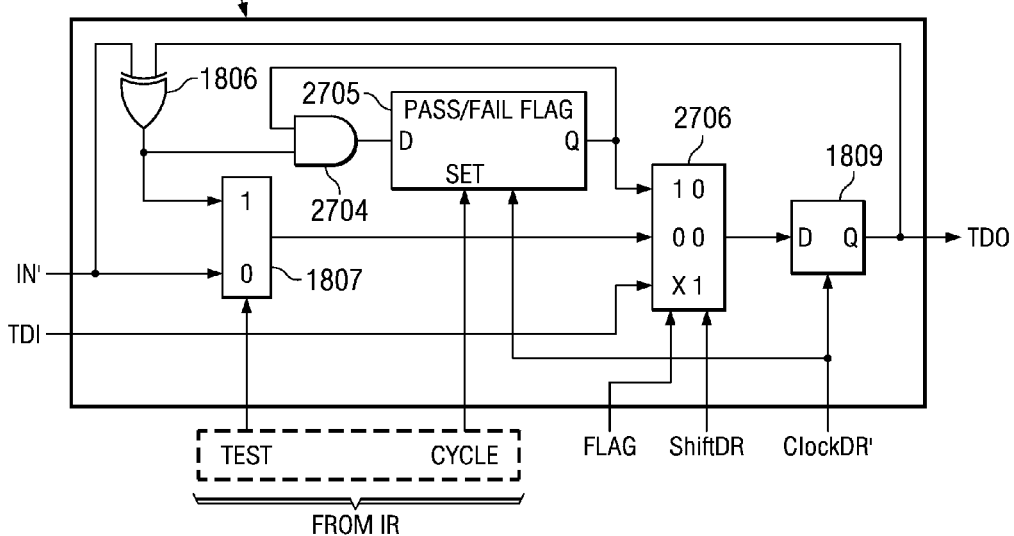
FIG. 27C is a block diagram of a circuit used in the block diagrams of FIGS. 27A and 27B.

At the end of the Cycle Test operation, the TAP 2304 transitions from Run Test/Idle to perform a data register scan operation to unload the values of the pass/fail flags of circuits 2703 of FIG. 27C.

Figure 25:
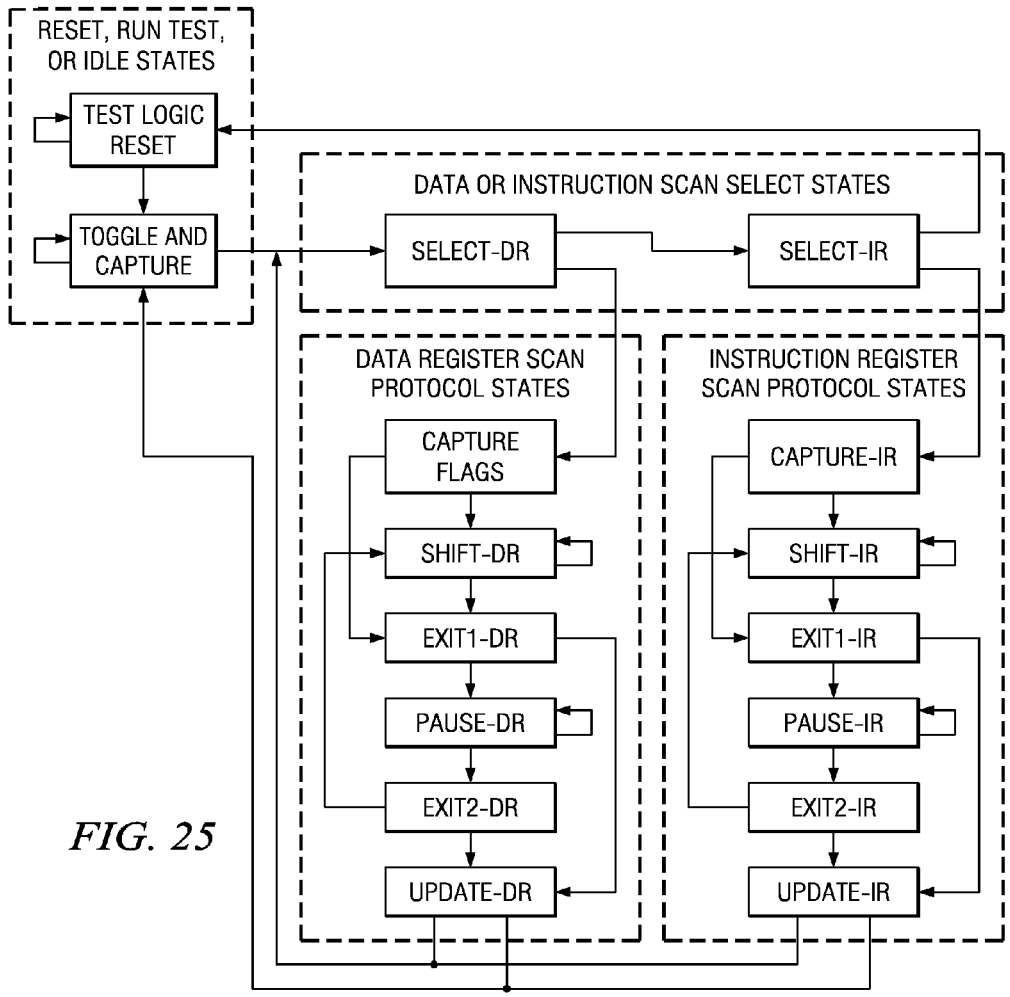
FIG. 25 is a flow chart of the impact of the Cycle Test instruction on certain states of the conventional JTAG TAP diagram.

FIG. 25 illustrates how the TAP 2304 states are used during the Cycle Test instruction. The Run Test/Idle state of FIG. 9 is used in FIG. 25 to perform the above described Toggle and Capture operations and the Capture-DR state of FIG. 9 is used in FIG. 25 as a Capture Flags state to capture the pass/fail Flags. When a TAP operating according to the states of FIG. 25 enters the Capture Flags state, the Flag signal from gate 2306 of FIG. 23 will be driven high by the TAP Capture-DR state indicator (CDR) output going high.

Figure 26B:
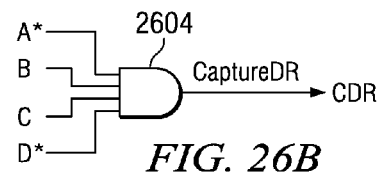
FIG. 26B is a block diagram of a Capture-DR state detection circuit added to the TAP to support the Cycle Test instruction of the present disclosure.

FIG. 26B illustrates an example gate added to TAP 2304 to detect and output the CDR signal when TAP 2304 is in the Capture-DR state. As seen in circuit 2703 of FIG. 27C, when the Flag input is high and Shift-DR input is low, mux 2706 selects the pass/fail value in D-FF 2705 to be captured into D-FF 1809 to be shifted out. Thus during the Cycle Test instruction, data register scan operations will capture and shift out pass/fail flag values instead of the conventional operation of capturing and shifting out the values at the IN' inputs of input cells 2701 and 2702.

Figure 24A:
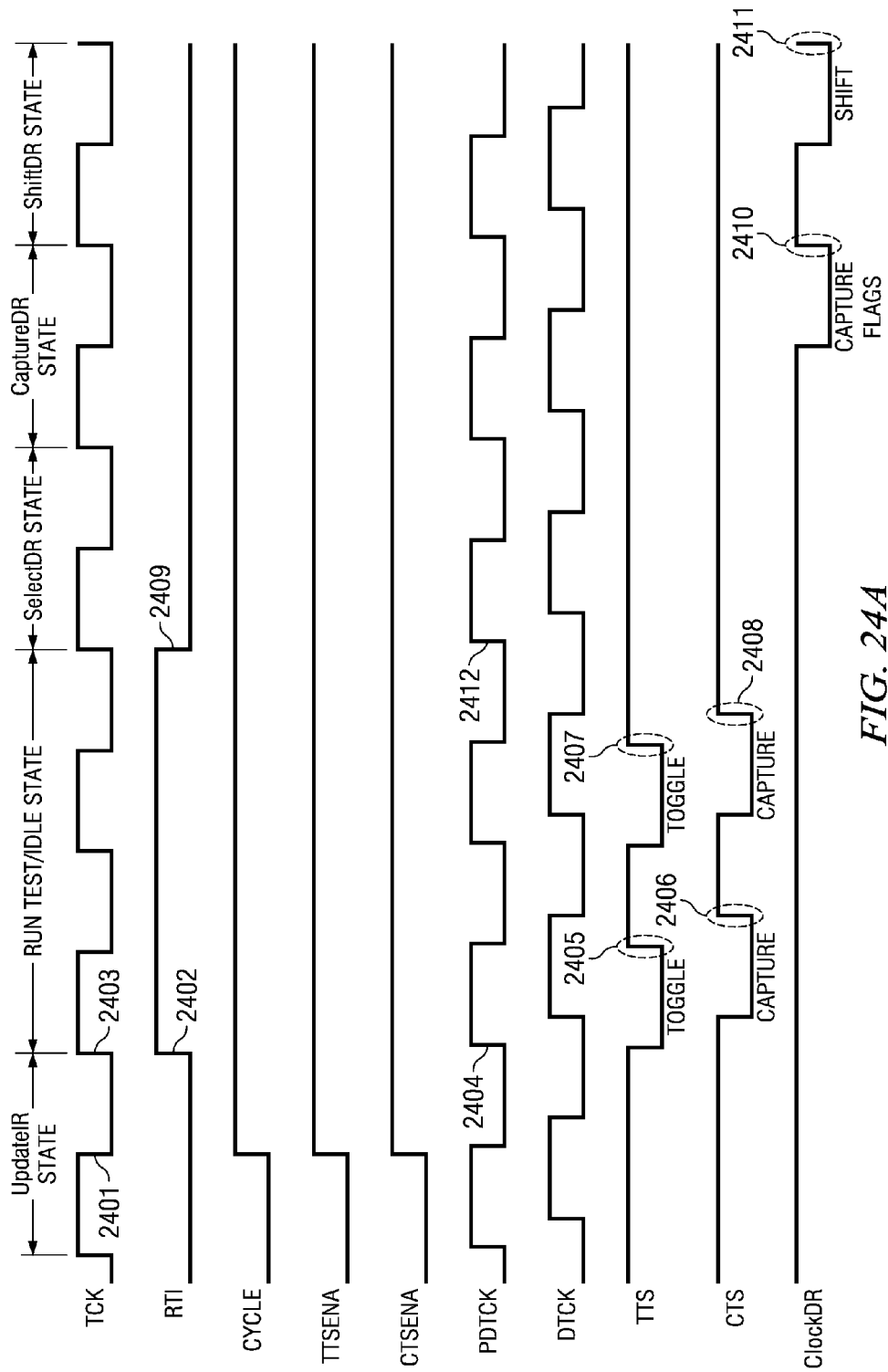
FIG. 24A is a timing diagram example of the operation of Cycle Test instruction as it executes in the Run Test/Idle state following the Update-IR state.

FIG. 24A illustrates a timing diagram of initiating the Cycle Test instruction operation by scanning in the instruction and updating it from the instruction register 2303. At time 2401 and on the falling edge of TCK in the TAP 2304 Update-IR state, the Cycle Test instruction is updated from the instruction register. In response to the update, the Cycle, TTSENA, and CTSENA signals on instruction register output bus 606 go high. From the Update-IR state, the TAP transitions to the Run Test/Idle state, which sets the TAP's RTI signal output high at time 2402. While not shown, the TAP's UPD/RTI signal output is also set high at time 2402. The Toggle output from gate 2305 goes high when RTI goes high which sets the output cells 2801 of the boundary register 2302 in their toggle mode.

In response to RTI (and UPD/RTI) being high, gate 604 passes the DTCK clock to the CTS output and gate 2307 passes the PDTCK clock to the TTS output. Both CTS and TTS are input to the boundary register via gates 605 (ClockDR') and 2308 (Update-DR'). The previously mentioned Delay circuit 2309 is included in the circuit example of FIG. 23 to provide a small delay between the TCK and the PDTCK to ensure that no glitches occur on the TTS clock when it is gated on and off by the RTI signal. The Delay circuit 2309 could be of the type described previously in FIG. 8A and simply provides a delay between the TCK and PDTCK, for example the delay from time 2403 to time 2404.

During the Run Test/Idle state, the first toggle and capture cycle operation occurs on the rising edges of TTS and CTS, respectively, at times 2405 and 2406. The second toggle and capture cycle operation occurs on the next rising edges of TTS and CTS at times 2407 and 2408. When the TAP transitions from the Run Test/Idle state to the Select-DR state, the RTI signal (and UPD/RTI) will go low at time 2409, which gates off further TTS and CTS clock signaling. Again, the small delay (provided by Delay circuit 2309) between TCK and PDTCK will allow RTI to go low at time 2409 prior to the rising edge of PDTCK at time 2412 to prevent a clock glitch from occurring on TTS when it is gated off. When the TAP transitions to the Capture-DR state, the TAP will enable its Clock-DR output. On the rising edge of the Clock-DR output at time 2410 the pass/fail flags 2705 of input cells 2701 and 2702 are captured into D-FF 1809. When the TAP enters the Shift-DR state, the captured pass/fail flag data is shifted out for inspection on each rising edge of TCK at time 2411.

Figure 24B:
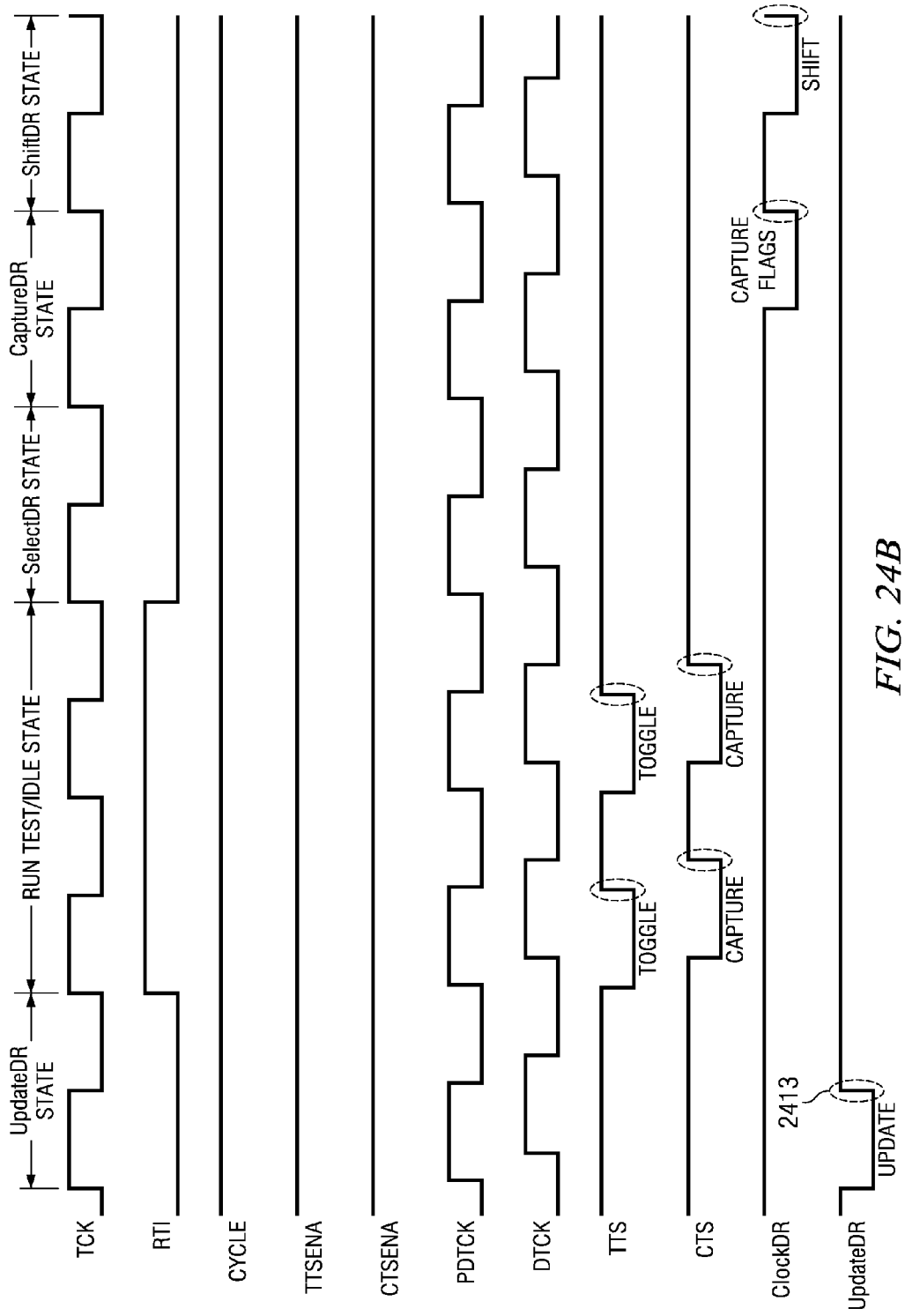
FIG. 24B is a timing diagram example of the operation of Cycle Test instruction as it executes in the Run Test/Idle state following the Update-DR state.

FIG. 24B shows that it is possible to execute a second toggle and capture test sequence following the first one shown in FIG. 24A. In FIG. 24B, the TAP is shown transitioning to the Update-DR state from the Shift-DR state of FIG. 24A, via state Exit1-DR of FIG. 25. In the Update-DR state, the input and output cells are updated with new test initialization data on the rising edge of the TAP's Update-DR clock at time 2413 to start the second toggle and capture test sequence. Upon transitioning from the Update-DR state to the Run Test/Idle state, the RTI signal goes high to begin the second toggle and capture test sequence. The operation of the remainder to second toggle and capture test sequence of FIG. 24B is identical to the first of FIG. 24A. Any number of subsequent toggle and capture test sequences may be performed.

While two toggle and capture cycle operations were shown occurring in the test sequences of FIGS. 24A and 24B, it is clear that the TAP could remain in the Run Test/Idle state for a lesser or greater number of TCK periods to enable a correspondingly lesser or greater number of toggle and capture cycle operations to occur.

Figure 24C:
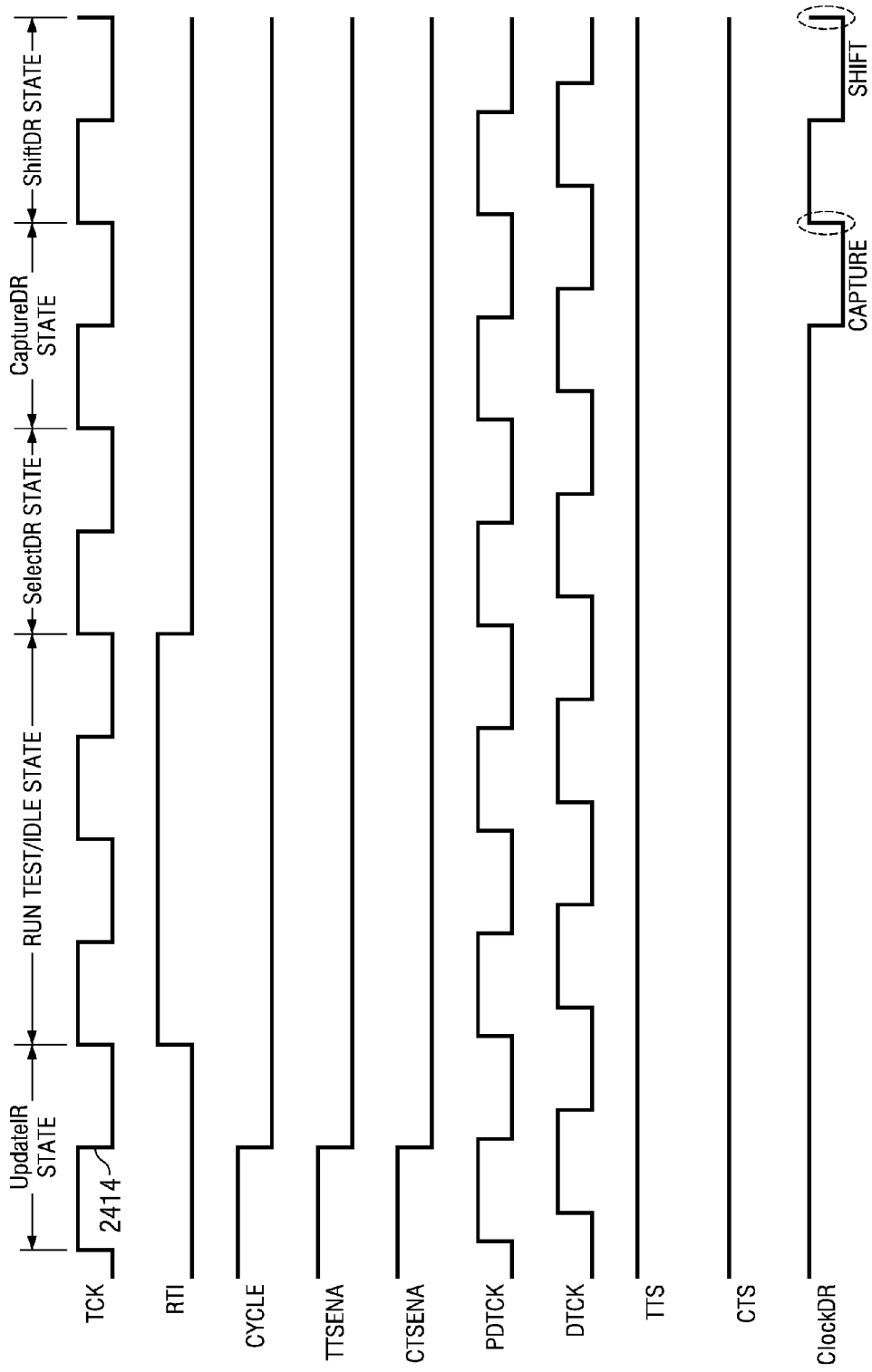
FIG. 24C is a timing diagram example of terminating the Cycle Test instruction by scanning in and updating another instruction.

FIG. 24C shows that after performing the Cycle Test instruction another instruction may be loaded into the instruction register 2303 to perform another task. When the other instruction is updated on the falling edge of TCK at time 2414, the Cycle, TTSENA, and CTSENA signal on bus 606 are set low to place the JTAG architecture in a mode other than the Cycle Test instruction mode. During the other instruction, entering the Run Test/Idle state does not cause activity on the TTS and CTS clock signals.

Figure 29:
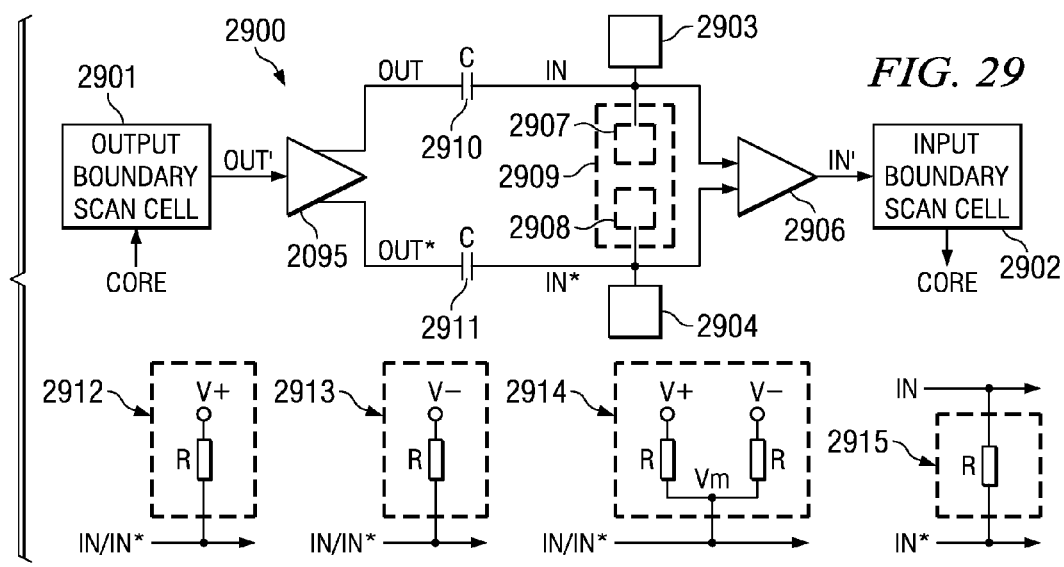
FIG. 29 is a block diagram of an example differential AC coupled interconnect circuit between integrated circuits that is rendered testable using the Propagation, Decay, and Cycle Test instructions of the present disclosure.

FIG. 29 illustrates a differential AC coupled interface network 2900 coupled between a first device output OUT & OUT* and a second device input IN & IN*. An output boundary cell 2901 drives the input to a differential output buffer 2905 of the first device, which produces output signals on differential AC signal paths 2910 and 2911. The output boundary cell 2901 can be of any type previously described, i.e. cell 101 or cell 2201 (2801). An input boundary cell 2902 receives the output of a differential input buffer of the second device, which receives the signals on differential AC signal paths 2910 and 2911. The input boundary cell 2902 can be of any type previously described, i.e. cell 102, cell 1401 (1801, 1802), or cell 2202 (2701, 2702).

In addition, an Observe Only input boundary cell 2903 is located on the second device IN input of differential AC coupled signal path 2910, and an Observe Only input boundary cell 2904 is located on the second device IN* input of differential AC coupled signal path 2911. Observe Only input cells 2903 and 2904 can be any of the previously described Observe Only cell types, i.e. cell 506, cell 1802, or cell 2702. The input or output cell types used will depend upon the type of test to be applied to the differential network 2900, i.e. a conventional JTAG Extest, or the Propagation Test, Decay Test, and/or Cycle Test of the present disclosure. While not shown, the input cells 2903, 2904, and 2902 are serially connected in a scan path in the second device to allow accessing them together during JTAG scan accesses and during control by the test instructions of the present disclosure.

The signal paths 2910 and 2911 may be terminated by various methods. Termination blocks 2907 and 2908 of signal paths 2910 and 2911 may use mixtures of pull up terminations 2912 and pull down terminations 2913. Alternately, a termination block 2909 may be used that uses a combination pull up and pull down termination 2914 or a simple coupling resistor 2915. Other types of termination methods may be used as well.

During the Propagation Test instruction, the boundary cell 2901 outputs a test signal to the output buffer 2905 which causes complementary output transitions on the OUT and OUT* signals. The transient response of the network 2900 is captured in the boundary cells 2903 and 2904 of the IN signal path 2910 and IN* signal path 2911 respectively. Also, the transient response output of the input buffer 2906 is simultaneously captured in boundary cell 2902. output. The Propagation Test output and capture operations occur in the Capture Test Strobe Window as previously described in the single ended AC coupled network Propagation Test example of FIG. 4. The only difference is that in the differential AC coupled network, three input boundary cells 2902, 2903, and 2904 are used instead of the single input boundary cell 102 of FIG. 4.

Input cell 2903 tests for proper operation of signal path 2910, input cell 2904 tests for proper operation of signal path 2911, and input cell 2902 tests for proper operation both signal paths and the input buffer 2906. While input cell 2902 could be used alone in the second device, additional input cells 2903 and 2904 of the second device provide diagnostic information in the event a failure was indicated by input cell 2902. For example, a stuck at zero or one, an open circuit, or a degraded signal path 2910 or 2905 due to a faulty or wrong value or R and/or C can be directly be detected by the input cells 2903 and 2904, as described previously in the single ended networks 108 and 2203.

During the Decay Test instruction, the boundary cell 2901 outputs a test signal to the output buffer 2905 which causes complementary output transitions on the OUT and OUT* signals. The first capture of the Decay Test obtains the transient response of the network 2900 in cells 2903, 2904, and 2902. The second capture of the Decay Test obtains the steady state response of the network 2900 in cells 2903, 2904, and 2902. The first and second capture operations occur as previously described in the single ended AC network of FIGS. 14 and 16. Again, the only difference between the single ended AC coupled network of FIG. 14 and the differential AC coupled network of FIG. 29, is that three input cells 2902, 2903, and 2904 are used instead of the single input boundary cell 1401. As mentioned above, the use of three input cells 2902, 2903, 2904 provides greater diagnostics in the event network 2900 fails the Decay Test.

During the Cycle Test instruction, the boundary cell 2901 outputs toggling test signals to the output buffer 2905 which causes complementary output transitions to occur on the OUT and OUT* signals. The capture operations of the Cycle Test obtains the transient response of the network 2900 in cells 2903, 2904, and 2902. Again, the only difference between single ended AC network of FIG. 22 and the differential AC coupled network of FIG. 29, is that three input cells 2902, 2903, and 2904 are used instead of the single input boundary cell 2202. Also again, the use of three input cells 2902, 2903, 2904 provides greater diagnostics in the event network 2900 fails the Cycle Test.

Figure 30:
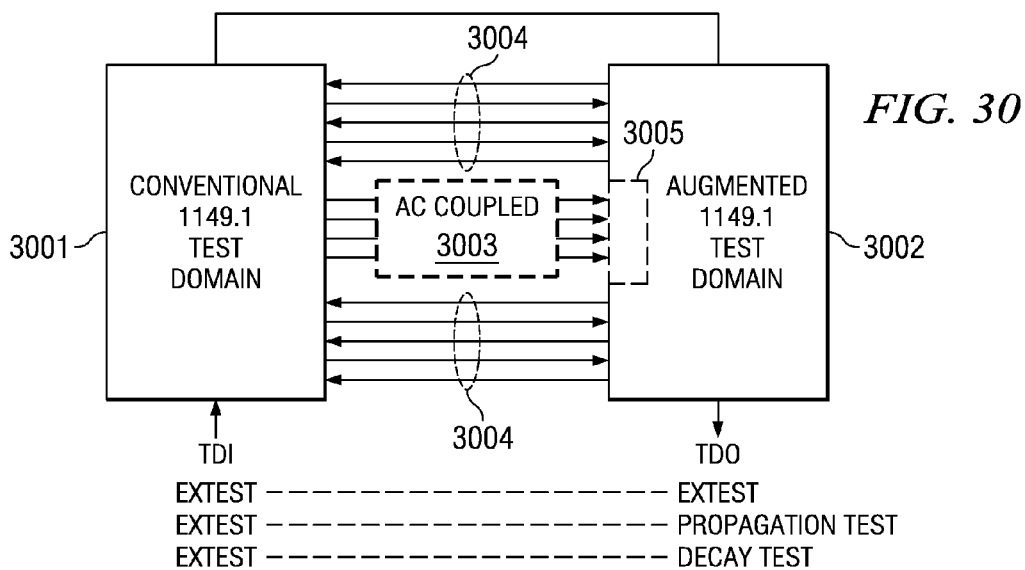
FIG. 30 is a block diagram of the testing of AC coupled interconnect circuits between an conventional 1149.1 test domain and an 1149.1 test domain augmented to include the Propagation and Decay Test instructions of the present disclosure.

FIG. 30 illustrates a conventional 1149.1 test domain 3001 interfaced 3003, 3004 to an 1149.1 test domain 3002 augmented, such as at block 3005, to perform the Propagation and Decay Test instructions of the present disclosure. The domains could be sub-circuits in an IC, die on an MCM, ICs on a board, boards in a backplane, or other possible realizations of at least two interconnect circuited domains, one having only 1149.1 and the other having 1149.1 augmented with the Propagation and Decay Tests of the present disclosure.

FIG. 30 illustrates that the Propagation and Decay Test instructions of the augmented 1149.1 domain 3002 can be used with a non-augmented 1149.1 domain 3001, if the non-augmented domain 3001 outputs to the augmented domain 3002. If both domains are loaded with the Extest Instruction, the digital connections 3004 between the domains are testable, but, as previously mentioned, the AC coupled 3003 interconnect circuits between the domains may not be testable. A first way to test the AC coupled interconnect circuits 3003 is to load domain 3001 with the Extest instruction and load domain 3002 with the Propagation Test instruction. Executing 1149.1 data scans (i.e. sequencing domain 3001 through the Data Register Scan Protocol States of FIG. 9 while in lock step sequencing domain 302 through the Data Register Scan Protocol States of FIG. 10) will cause domain 3001 to output test data during the Update-DR state while domain 3002 initiates the capture process during the Update-DR state (i.e. in the Capture Test Strobe Window of FIG. 4).

This can be seen more clearly by assuming boundary cell 101 of FIG. 4 is in domain 3001 and boundary cell 102 of FIG. 4 is in domain 3002 and inspecting the timing diagram of FIG. 4. Thus a domain that includes the Propagation Test instruction can operate to receive test signals from a domain that includes the Extest instruction to perform the Propagation Test operation.

A second way to test the AC coupled interconnect circuits 3003 is to load domain 3001 with the Extest instruction and load domain 3002 with the Decay Test instruction. Executing 1149.1 data scans, as described above, will cause domain 3001 to output test data during the Update-DR state while domain 3002 initiates the first capture (Capture 1) during the Update-DR state (i.e. in the Capture Test Strobe Window of FIG. 14) and that performs the second capture (Capture2) in the Capture-DR state. This can be seen more clearly by assuming boundary cell 101 of FIG. 14 is in domain 3001 and boundary cell 1401 of FIG. 14 is in domain 3002 and inspecting the timing diagram of FIG. 14. Thus a domain that includes the Decay Test instruction can receive test signals from a domain that includes the Extest instruction and perform the Decay Test operation.

While the present disclosure has been described in detail, it should be understood that various changes, substitutions, and alterations can be made herein without departing from the spirit and scope of the disclosure as defined by the appended claims.

What is claimed is:

1. A test circuit comprising:
   A. a tap controller having a test clock input lead, a test mode select input lead, and state output leads;
   B. An instruction register having a test data input lead, a test data output lead, a mode output lead and control bus output leads;
   C. boundary scan register circuitry having a test data input lead, a test data output lead, and a mode input lead connected to the respective instruction register test data input, test data output, and mode output leads, having state input leads connected to the state output leads of the tap controller, and having a state clock input lead; and
   D. capture test strobe circuitry having a test clock input lead connected to the test clock input lead of the tap controller, state input leads connected to the state output leads of the tap controller, an enable input lead connected to the control bus output leads of the instruction register, and a state clock output lead connected to the state clock input lead of the boundary scan register circuitry.

2. The test circuitry of claim 1 in which the state output leads of the tap controller include an UpdateDR output lead, a ClockDR output lead, and a ShiftDR output lead.

3. The test circuitry of claim 1 in which the control bus output leads include a capture test strobe enable lead connected to the enable input lead of the capture test strobe circuitry.

4. The test circuitry of claim 1 in which the state input leads of the capture test strobe circuitry include an UpdateDR input lead and a ClockDR input lead connected respectively to an UpdateDR output lead and a ClockDR output lead of the state output leads of the tap controller.

5. The test circuitry of claim 1 in which the state clock output lead is a ClockDR' output lead.

6. The test circuitry of claim 1 in which the capture test strobe circuitry includes a delay circuit having an input connected to the test clock input lead and a delay test clock output lead.

* * * * *